United States Patent
Amanuma et al.

(10) Patent No.: US 8,766,705 B2
(45) Date of Patent: Jul. 1, 2014

(54) SEMICONDUCTOR INTEGRATED CIRCUIT AND DATA PROCESSING SYSTEM

(71) Applicant: Renesas Electronics Corporation, Kawasaki (JP)

(72) Inventors: Yoshiyuki Amanuma, Kanagawa (JP); Yoichi Tsuchiya, Kokubunji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/680,486

(22) Filed: Nov. 19, 2012

(65) Prior Publication Data

US 2013/0076430 A1 Mar. 28, 2013

Related U.S. Application Data

(62) Division of application No. 13/019,917, filed on Feb. 2, 2011, now abandoned.

(30) Foreign Application Priority Data

Feb. 5, 2010 (JP) .................................. 2010-23848

(51) Int. Cl.
*H03K 3/42* (2006.01)
(52) U.S. Cl.
USPC ........................................................ 327/514

(58) Field of Classification Search
None
See application file for complete search history.

(56) References Cited

U.S. PATENT DOCUMENTS

| | | | |
|---|---|---|---|
| 5,682,123 A | 10/1997 | Chau | |
| 6,426,671 B1 * | 7/2002 | Kono | 327/541 |
| 7,442,950 B2 | 10/2008 | Osame et al. | |
| 2004/0120195 A1 | 6/2004 | Okuda | |

FOREIGN PATENT DOCUMENTS

| | | |
|---|---|---|
| JP | 2004-206680 A | 7/2004 |
| JP | 2008-198700 A | 8/2008 |

* cited by examiner

*Primary Examiner* — Crystal L Hammond
(74) *Attorney, Agent, or Firm* — Miles & Stockbridge P.C.

(57) ABSTRACT

An arrangement for detecting local light irradiation in an illegal attack attempt to intentionally induce a malfunction or faulty condition is formed on a small chip occupancy area so as to provide high detection sensitivity. In a region containing a logic circuit, a plurality of series-coupled detection inverters are distributively disposed as photodetector elements having a constant logical value of primary-stage input. When at least one of the series-coupled detection inverters is irradiated with light, an output thereof is inverted, thereby producing a final output through the series-coupled detection inverters. Based on the final output thus produced, local light irradiation can be detected.

12 Claims, 26 Drawing Sheets (INVERSION WITH LOW-LEVEL INPUT (H ⇒ L))

(INVERSION WITH HIGH-LEVEL INPUT (L ⇒ H))

IN A CASE WHERE THE PHOTODETECTOR ELEMENT D PROVIDES A HIGH-LEVEL OUTPUT IN THE INITIAL STATE, $V_{LT}$ OF THE BUFFER INVERTER IS INCREASED

IN A CASE WHERE THE PHOTODETECTOR ELEMENT D PROVIDES A LOW-LEVEL OUTPUT IN THE INITIAL STATE, $V_{LT}$ OF THE BUFFER INVERTER IS DECREASED (A-A SECTIONAL VIEW)

(B-B SECTIONAL VIEW)

SEMICONDUCTOR INTEGRATED CIRCUIT AND DATA PROCESSING SYSTEM

CROSS-REFERENCE TO RELATED APPLICATIONS

The disclosure of Japanese Patent Application No. 2010-23848 filed on Feb. 5, 2010 including the specification, drawings and abstract is incorporated herein by reference in its entirety.

BACKGROUND OF THE INVENTION

The present invention relates to a semiconductor integrated circuit capable of suppressing the occurrence of a malfunction to be intentionally induced with light irradiation, and also to a data processing system using the same. In particular, the present invention relates to a technique that is effectively applicable to a microcomputer embedded in an IC card, for example.

A microcomputer embedded in an IC card to be used for such a purpose as user authentication (called a security microcomputer) might be subjected to a fault-based attack that intentionally induces a malfunction or faulty condition for illegally obtaining or tampering with secret information held in the IC card. For intentional induction of a malfunction in the security microcomputer, an abnormal power supply voltage, a clock signal having an excessively high frequency, a beam of laser light irradiation, or the like is applied thereto. A fault-based attack using laser light irradiation is regarded as one of the most serious security threats since a malfunction can be forced to occur in a local portion. Recently, there has been an increasing demand for security protection against a fault-based attack using laser light irradiation, and most of the security microcomputers are provided with a protective circuit against laser light irradiation in an illegal attack attempt. As a countermeasure against laser light irradiation, there is a technique using photodetector elements for detecting laser light irradiation. Since the mounting of a multiplicity of photodetector elements on a chip is required for detection of local laser light irradiation, it is desired to provide small-sized photodetector elements having excellent sensitivity of detection.

In Patent Document 1 indicated below, there is disclosed a semiconductor integrated circuit using photodetector elements having an npnp thyristor structure. Further, in Patent Document 2 indicated below, there is disclosed a circuit configuration wherein a plurality of MOS transistors are coupled between an input line and a ground line of a reset circuit for generating a reset signal, and an output terminal of each photodetector element is coupled to a gate of each MOS transistor.

RELATED ART REFERENCES

Patent Documents

Patent Document 1:
Japanese Unexamined Patent Publication No. 2008-198700
Patent Document 2:
Japanese Unexamined Patent Publication No. 2004-206680

SUMMARY OF THE INVENTION

In a case where photodetector elements having an npnp thyristor structure are used, the size of each photodetector element is relatively large, causing a constraint to be imposed on a layout design arrangement of the photodetector elements in terms of area dimensions. Further, in a case where an output terminal of each photodetector element is coupled to each of a plurality of MOS transistors, it is required to provide a plurality of MOS transistors for each photodetector element, thereby imposing a constraint on a photodetector element layout design arrangement in terms of area dimensions as in the case mentioned above. In the Patent Documents 1 and 2, no description is given regarding a technique for enhancing detection sensitivity to light irradiation.

It is therefore an object of the present invention to provide a semiconductor integrated circuit wherein, on a small chip occupancy area, there is implemented an arrangement for detecting local light irradiation in an illegal attack attempt to intentionally induce a malfunction or faulty condition, and also to provide a data processing system using the semiconductor integrated circuit.

Further, it is another object of the present invention to provide a semiconductor integrated circuit having high detection sensitivity to local light irradiation in an illegal attack attempt to intentionally induce a malfunction or faulty condition, and also to provide a data processing system using the semiconductor integrated circuit.

The above and other objects, features, and advantages of the present invention will become more apparent from the following detailed description with reference to the accompanying drawings.

The representative aspects of the present invention are briefed below:

In a region containing a logic circuit, a plurality of series-coupled detection inverters is distributively disposed as photodetector elements having a constant logical value of primary-stage input. When at least one of the series-coupled detection inverters is irradiated with light, an output thereof is inverted, thereby producing a final output through the series-coupled detection inverters. Based on the final output thus produced, local light irradiation can be detected.

As a minimum unit serving as a photodetector element, an inverter is used in which a switching state thereof is initially determined upon receipt of a signal input through a series path. At the time of local laser irradiation to the inverter, a leak current is produced at each reverse-biased pn junction thereof. More specifically, a leak current is produced at a pn junction between well regions containing a p-channel MOS transistor and an n-channel MOS transistor respectively, and also at a pn junction between well regions for common drain of a p-channel MOS transistor and an n-channel MOS transistor coupled at an inverter output. Thus, a large leak current can be formed readily, thereby making it possible to provide high detection sensitivity to light irradiation.

By virtue of the high detection sensitivity, it is not required to provide a large area for detection of light irradiation, i.e., a chip occupancy area for light detection can be reduced. Moreover, the sensitivity of detection using an inverter circuit can be increased further by reducing a current feeding capacity of a transistor to be turned on in an initial state.

To sum up, the following advantageous effects are provided according to the representative aspects of the present invention:

In accordance with the present invention, on a small chip occupancy area, it is possible to implement an arrangement for detecting local light irradiation in an illegal attack attempt to intentionally induce a malfunction or faulty condition.

Further, in accordance with the present invention, it is possible to enhance detection sensitivity to local light irradiation.

DETAILED DESCRIPTION OF THE PREFERRED EMBODIMENTS

1. Overviews of the Preferred Embodiments

Figure 1:
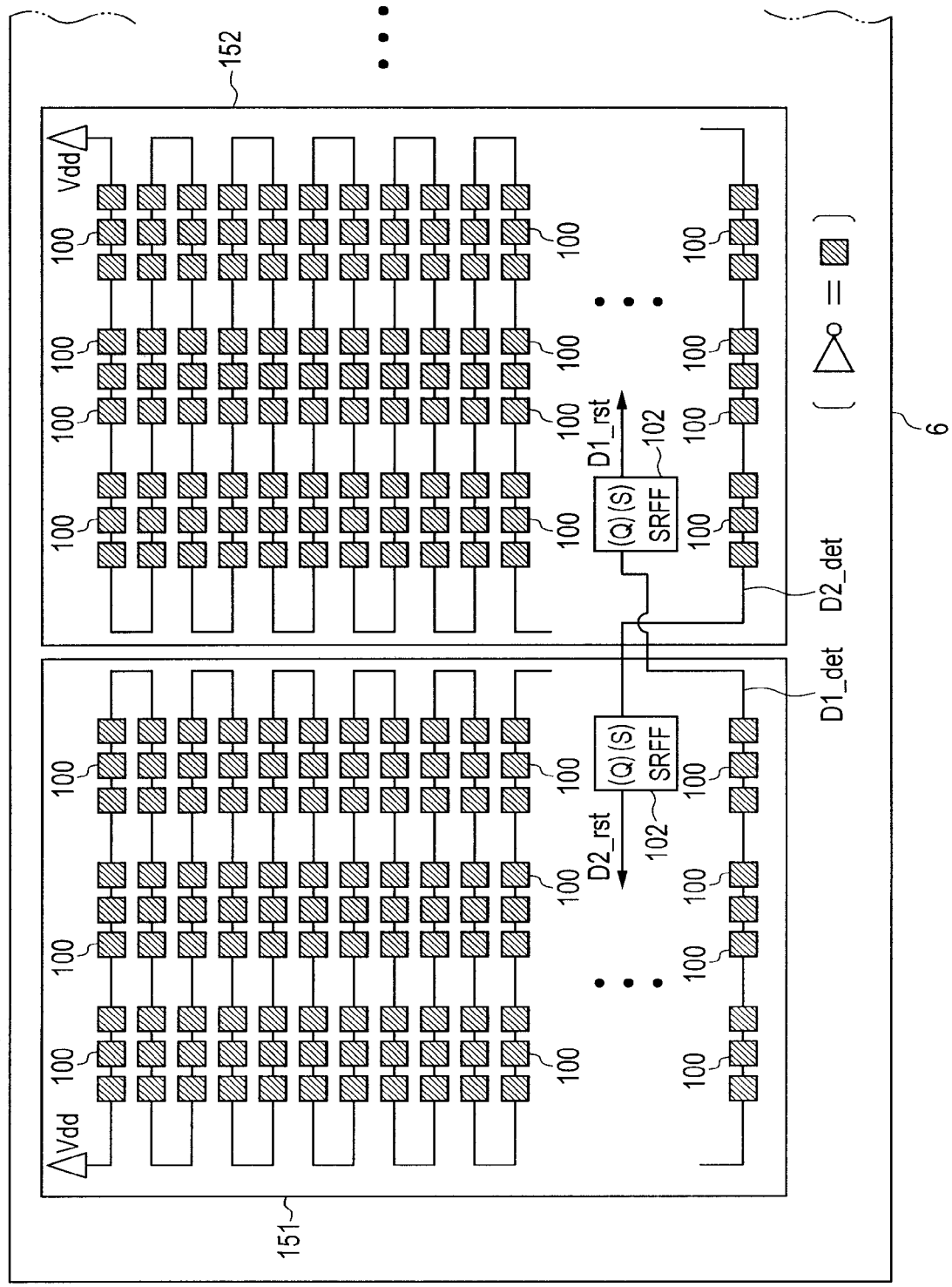
FIG. 1 is a block diagram illustrating a circuit configuration wherein a multiplicity of CMOS inverters serving as detection inverters are series-coupled in a logic circuit of a microcomputer according to a preferred embodiment 1 of the present invention.

First, the present invention will be described below regarding the overviews of representative preferred embodiments thereof. It is to be noted that, in the following description of the overviews of the representative preferred embodiments, parenthesized reference characters are used for illustrative purposes only and designate respective parts that are included in the concepts of corresponding component elements identified by reference characters in the accompanying drawings.

[1] <Inverter Series-Coupling Configuration>

In accordance with a representative preferred embodiment of the present invention, there is provided a semiconductor integrated circuit (1) comprising: a logic circuit (6); a plurality of series-coupled detection inverters (100) that are distributively disposed in a region containing the logic circuit and are arranged to have a constant logical value of primary-stage input; a detection circuit (102) for detecting an input logical value inversion due to an output inversion of the detection inverter at the time of light irradiation; and a limiter circuit (12) for imposing limitation on operation of the logic circuit in response to the input logical value inversion detected by the detection circuit. The logic circuit, the detection inverters, the detection circuit, and the limiter circuit are formed in a single semiconductor chip.

As a minimum unit serving as a photodetector element, an inverter is used in which a switching state thereof is initially determined upon receipt of a signal input through a series path. At the time of local laser irradiation to the inverter, a leak current is produced at each reverse-biased pn junction thereof. More specifically, a leak current is produced at a pn junction between well regions containing a p-channel MOS transistor and an n-channel MOS transistor respectively, and also at a pn junction between well regions for common drain of a p-channel MOS transistor and an n-channel MOS transistor coupled at an inverter output. Thus, a large leak current can be formed readily, thereby making it possible to provide high detection sensitivity to light irradiation. By virtue of the high detection sensitivity, it is not required to provide a large area for detection of light irradiation, i.e., a chip occupancy area for light detection can be reduced. Moreover, the sensitivity of light detection using an inverter circuit can be increased further by reducing a current feeding capacity of a transistor to be turned on in an initial state.

[2] <Kind of Gate>

In the semiconductor integrated circuit mentioned in item 1, each of the detection inverters comprises a CMOS inverter element, and either one of a NAND gate having all inputs thereof coupled in common and a NOR gate having all inputs thereof coupled in common.

[3] <Reduction in Power Feeding Capacity>

In the semiconductor integrated circuit mentioned in item 1 or 2, a first resistor element (R1) is disposed on the power supply terminal side of a detection inverter that outputs a high level in a state prior to light irradiation. Thus, the sensitivity in inverter-based light detection can be increased by reducing the current feeding capacity of the detection inverter that outputs a high level in a state prior to light irradiation.

[4] <Well Isolation>

In the semiconductor integrated circuit mentioned in item 3, a first semiconductor region (130) containing a high-level-output transistor formed in the detection inverter that outputs a high level in a state prior to light irradiation is isolated from a second semiconductor region (126) containing a transistor formed in the logic circuit and having a characteristic of the same conduction type as that of the first semiconductor region. Through the first resistor element (R1), a power supply voltage (Vdd) is applied to the first semiconductor region from a power feeding path extending in the second semiconductor region.

The first and second semiconductor regions are isolated from each other as described above. Hence, in a case where the resistor element is disposed in the power feeding path to the first semiconductor region, it is possible to prevent an adverse effect on power feeding to the second semiconductor region containing the transistor formed in the logic circuit.

[5] <Reduction in Power Feeding Capacity>

In the semiconductor integrated circuit mentioned in item 1 or 2, a second resistor element (R2) is disposed on the ground terminal side of a detection inverter that outputs a low level in a state prior to light irradiation. Thus, the sensitivity in inverter-based light detection can be increased by reducing the current feeding capacity of the detection inverter that outputs a low level in a state prior to light irradiation.

[6] <Well Isolation>

In the semiconductor integrated circuit mentioned in item 5, a third semiconductor region (140) containing a low-level-output transistor formed in the detection inverter that outputs a low level in a state prior to light irradiation is isolated from a fourth semiconductor region (121) containing a transistor formed in the logic circuit and having a characteristic of the same conduction type as that of the third semiconductor region. Through the second resistor element (R2), a ground voltage (Vss) is applied to the third semiconductor region from a power feeding path extending in the fourth semiconductor region.

The third and fourth semiconductor regions are isolated from each other as described above. Hence, in a case where the resistor element is disposed in the power feeding path to the third semiconductor region, it is possible to prevent an adverse effect on power feeding to the fourth semiconductor region containing the transistor formed in the logic circuit.

[7] <$V_{LT}$ of Buffer Inverter>

In the semiconductor integrated circuit mentioned in any one of items 1 to 6, there is provided an arrangement wherein a buffer inverter (101) is disposed between the detection inverters, and wherein a logical threshold voltage $V_{LT}$ of the buffer inverter located at a stage posterior to the detection inverter that outputs a high level in a state prior to light irradiation is set to be higher than a logical threshold voltage of the inverter included in the logic circuit. Thus, in the detection inverter wherein an output potential thereof decreases at the time of light irradiation, it is possible to enhance detection sensitivity with respect to output variations.

[8] <$V_{LT}$ of Buffer Inverter>

In the semiconductor integrated circuit mentioned in any one of items 1 to 6, there is provided an arrangement wherein a buffer inverter is disposed between the detection inverters, and wherein a logical threshold voltage $V_{LT}$ of the buffer inverter located at a stage posterior to the detection inverter that outputs a low level in a state prior to light irradiation is set to be lower than a logical threshold voltage of the inverter included in the logic circuit. Thus, in the detection inverter wherein an output potential increases at the time of light irradiation, it is possible to enhance detection sensitivity with respect to output variations.

[9] <Detection Circuit Layout>

In the semiconductor integrated circuit mentioned in any one of items 1 to 8, a series circuit of the inverters and a detection circuit are disposed individually in each of partial circuit regions (151, 152) of the logic circuit. The series circuit of the inverters and the detection circuit disposed in each partial circuit region are coupled so as to provide a form of coupling between mutually different circuit regions. Thus, it is possible to prevent the occurrence of a malfunction in the detection circuit due to local light irradiation.

[10] <Data Processing Unit>

In the semiconductor integrated circuit mentioned in any one of items 1 to 9, there are further provided a plurality of memory devices (2, 3, 4) to be used by the logic circuit, and the logic circuit includes a plurality of data processing units (14, 15) for carrying out data processing operations by using information held in the memory devices. Thus, it is possible to provide protection against illegal tampering with programs stored in the data processing units and protection against illegal access to secret data to be used by the data processing units.

[11] <Data Processing System>

In accordance with another representative preferred embodiment of the present invention, there is provided a data processing system comprising a plurality of semiconductor integrated circuits (1, 306, 307) mounted on a circuit board, wherein at least one of the semiconductor integrated circuits is arranged to have a logic circuit (6) including a plurality of data processing units (14, 15) for carrying out data processing operations. The at least one of the semiconductor integrated circuits comprises a plurality of series-coupled detection inverters that are distributively disposed in a region containing the logic circuit and are arranged to have a constant logical value of primary-stage input; a detection circuit for detecting an input logical value inversion due to an output inversion of the detection inverter at the time of light irradiation; and a limiter circuit for imposing limitation on operation of the logic circuit in response to the input logical value inversion detected by the detection circuit.

Since the semiconductor integrated circuit is provided with photodetector elements requiring just a small chip occupancy area, no particular constraint is imposed on a layout design arrangement of the photodetector elements in terms of area dimensions in most cases. On account of the condition that an adequate number of photodetector elements are mountable, reliable detectability of light irradiation can be ensured with ease. Thus, it is possible to provide a high level of security against a fault-based attack to the data processing system.

[12] <Diode Parallel-Coupling Configuration>

In accordance with still another representative preferred embodiment of the present invention, there is provided a semiconductor integrated circuit (1) comprising: a logic circuit (6); a plurality of series-coupled buffers (201) that are distributively disposed in a region containing the logic circuit and are arranged to have a constant logical value of primary-stage input; a plurality of parallel-coupled detection diodes (200) that are in a reverse-biased state with respect to a signal path (PSS) between an input of each of the buffers and an output of a buffer located at a stage anterior thereto; a detection circuit (202) for detecting an input logical value inversion due to a change to a forward-biased state in the detection diode at the time of light irradiation; and a limiter circuit (12) for imposing limitation on operation of the logic circuit in response to the input logical value inversion detected by the detection circuit. The logic circuit, the buffers, the detection diodes, the detection circuit, and the limiter circuit are formed in a single semiconductor chip.

A plurality of detection diodes are coupled between buffers disposed in a pair form. Hence, this arrangement makes it possible to attain a higher degree of area efficiency than that in a case where a buffer is disposed for each detection diode, and also to attain a higher detection speed than that in a case where no buffers are disposed.

[13] <Increase in Light-Receiving Area>

In the semiconductor integrated circuit mentioned in item 12, the logic circuit and the detection diode are formed in a semiconductor region (228) having a predetermined height dimension wherein a p-type well region (221) receiving power from a ground line (220) is in juxtaposition with an n-type well region (226) receiving power from a power supply line (225). With the detection diode coupled in a reverse-biased state between the signal path and the ground line, i.e., with the cathode of the detection diode coupled to the signal path and the anode thereof coupled to the ground line, a p-type well region (221_D) containing the detection diode is enlarged as compared with the height dimension of a p-type well region containing the logic circuit. An n-type semiconductor region (240) having a pn junction with the enlarged p-type well region is configured as a cathode. Thus, the light receiving area of the detection diode is increased to enable enhancement in detection sensitivity.

[14] <Decrease in Leak Current Path Length>

In the semiconductor integrated circuit mentioned in item 13, a p-type semiconductor region corresponding to a ground line, from which power feeding is applied to the p-type well region containing the detection diode, is arranged to protrude toward the opposing side of the n-type semiconductor region configuring the cathode (dis_D). Thus, a path of a leak current to be produced at the reverse-biased pn junction at the time of light irradiation is shortened, thereby enhancing detection sensitivity to light irradiation.

[15] <Reduction in Silicide Area>

In the semiconductor integrated circuit mentioned in item 13, a silicide area (250) for coupling the n-type semiconductor region containing the pn junction to a metallic layer corresponding to the signal path is formed limitedly in a peripheral part of a contact hole between the n-type semiconductor region and the metallic layer. The silicide area formed limitedly as mentioned above makes it possible to prevent a decrease in detection sensitivity, which would otherwise be incurred by optical shielding over the entire n-type semiconductor region.

[16] <Increase in Light Receiving Area>

In the semiconductor integrated circuit mentioned in item 12, the logic circuit and the detection diode are formed in a semiconductor region having a predetermined height dimension wherein a p-type well region receiving power from the ground line is in juxtaposition with an n-type well region receiving power from the power supply line. With the detection diode coupled in a reverse-biased state between the signal path and the power supply line, i.e., with the anode of the detection diode coupled to the signal path and the cathode thereof coupled to the power supply line, an n-type well region containing the detection diode is enlarged as compared with the height dimension of an n-type well region containing the logic circuit. A p-type semiconductor region having a pn junction with the enlarged n-type well region is configured as an anode. Thus, the light receiving area of the detection diode is increased to enable enhancement in detection sensitivity.

[17] <Decrease in Leak Current Path Length>

In the semiconductor integrated circuit mentioned in item 16, the n-type semiconductor region corresponding to a power supply line, from which power feeding is applied to the n-type well region containing the detection diode, is arranged to protrude toward the opposing side of the p-type semiconductor region configuring the anode. Thus, a path of a leak current to be produced at the reverse-biased pn junction at the time of light irradiation is shortened, thereby enhancing detection sensitivity to light irradiation.

[18] <Reduction in Silicide Area>

In the semiconductor integrated circuit mentioned in item 15, a silicide area for coupling the p-type semiconductor region containing the pn junction to a metallic layer corresponding to the signal path is formed limitedly in a peripheral part of a contact hole between the p-type semiconductor region and the metallic layer. The silicide area formed limitedly as mentioned above makes it possible to prevent a decrease in detection sensitivity, which would otherwise be incurred by optical shielding over the entire p-type semiconductor region.

[19] <Power Feeding Capacity and $V_{LT}$ of Buffer>

In the semiconductor integrated circuit mentioned in any one of items 13 to 18, with the detection diode coupled in a reverse-biased state between the signal path and the ground line, i.e., with the cathode of the detection diode coupled to the signal path and the anode thereof coupled to the ground line, the buffer is configured of series-coupled inverters at two stages, i.e., a primary-stage inverter and a posterior-stage inverter (271, 272). A logical threshold voltage $V_{LT}$ of the primary-stage inverter (271) is set to be higher than that of the inverter included in the logic circuit. Further, a power current feeding capacity of the posterior-stage inverter (272) is set to be smaller than that of the inverter included in the logic circuit.

Since the logical threshold voltage of the primary-stage inverter is higher than that of the inverter included in the logic circuit, it is possible to increase detection sensitivity to a logical value inversion due to current drawing from the cathode of the detection diode at the time of light irradiation thereto. Further, since the power current feeding capacity of the posterior-stage inverter is smaller than that of the inverter included in the logic circuit, it is possible to increase the speed of current drawing from the cathode of the detection diode at the time of light irradiation thereto. Thus, a higher level of sensitivity in light detection can be realized. It is to be noted that a logical threshold voltage of the posterior-stage inverter may be equal to or different from that of the inverter included in the logic circuit.

[20] <Power Feeding Capacity and $V_{LT}$ of Buffer>

In the semiconductor integrated circuit mentioned in any one of items 13 to 18, with the detection diode coupled in a reverse-biased state between the signal path and the power supply line, i.e., with the anode of the detection diode coupled to the signal path and the cathode thereof coupled to the power supply line, the buffer is configured of series-coupled inverters at two stages, i.e., a primary-stage inverter and a posterior-stage inverter. A logical threshold voltage of the primary-stage inverter is set to be lower than that of the inverter included in the logic circuit. Further, a ground current feeding capacity of the posterior-stage inverter is set to be smaller than that of the inverter included in the logic circuit.

Since the logical threshold voltage of the primary-stage inverter is lower than that of the inverter included in the logic circuit, it is possible to enhance detection sensitivity to a logical value inversion due to current feeding to the anode of the detection diode at the time of light irradiation thereto. Further, since the ground current feeding capacity of the posterior-stage inverter is smaller than that of the inverter included in the logic circuit, it is possible to increase the speed of current feeding to the anode of the detection diode at the time of light irradiation thereto. Thus, a higher level of sensitivity in light detection can be realized. It is to be noted that a logical threshold voltage of the posterior-stage inverter may be equal to or different from that of the inverter included in the logic circuit.

[21] <Detection Circuit Layout>

In the semiconductor integrated circuit mentioned in any one of items 12 to 20, a series circuit of the buffers and diodes, and a detection circuit are disposed individually in each of partial circuit regions (251, 252) of the logic circuit. The series circuit of the buffers and inverters, and the detection circuit disposed in each partial circuit region are coupled so as to provide a form of coupling between mutually different circuit regions. Thus, it is possible to prevent the occurrence of a malfunction in the detection circuit due to local light irradiation.

[22] <Data Processing Unit>

In the semiconductor integrated circuit mentioned in any one of items 12 to 20, there are further provided a plurality of memory devices to be used by the logic circuit, and the logic circuit includes a plurality of data processing units for carrying out data processing operations by using information held in the memory devices. Thus, it is possible to provide protection against illegal tampering with programs stored in the data processing units and protection against illegal access to secret data to be used by the data processing units.

[23] <Data Processing System>

In accordance with even still another representative embodiment of the present invention, there is provided a data processing system comprising a plurality of semiconductor integrated circuits mounted on a circuit board, wherein at least one of the semiconductor integrated circuits is arranged to have a logic circuit including a plurality of data processing units for carrying out data processing operations. The at least one of the semiconductor integrated circuits comprises a plurality of series-coupled buffers that are distributively disposed in a region containing the logic circuit and are arranged to have a constant logical value of primary-stage input; a plurality of parallel-coupled detection diodes that are in a reverse-biased state with respect to a signal path between an input of each of the buffers and an output of a buffer located at a stage anterior thereto; a detection circuit for detecting an input logical value inversion due to a change to a forward-biased state in the detection diode at the time of light irradiation; and a limiter circuit for imposing limitation on operation of the logic circuit in response to the input logical value inversion detected by the detection circuit.

Since the semiconductor integrated circuit is provided with photodetector elements requiring just a small chip occupancy area, no particular constraint is imposed on a layout design arrangement of the photodetector elements in terms of area dimensions in most cases. On account of the condition that an adequate number of photodetector elements are mountable, reliable detectability of light irradiation can be ensured with ease. Thus, it is possible to provide a high level of security against a fault-based attack to the data processing system.

2. Details of the Preferred Embodiments

Preferred Embodiment 1

<Microcomputer>

Figure 2:
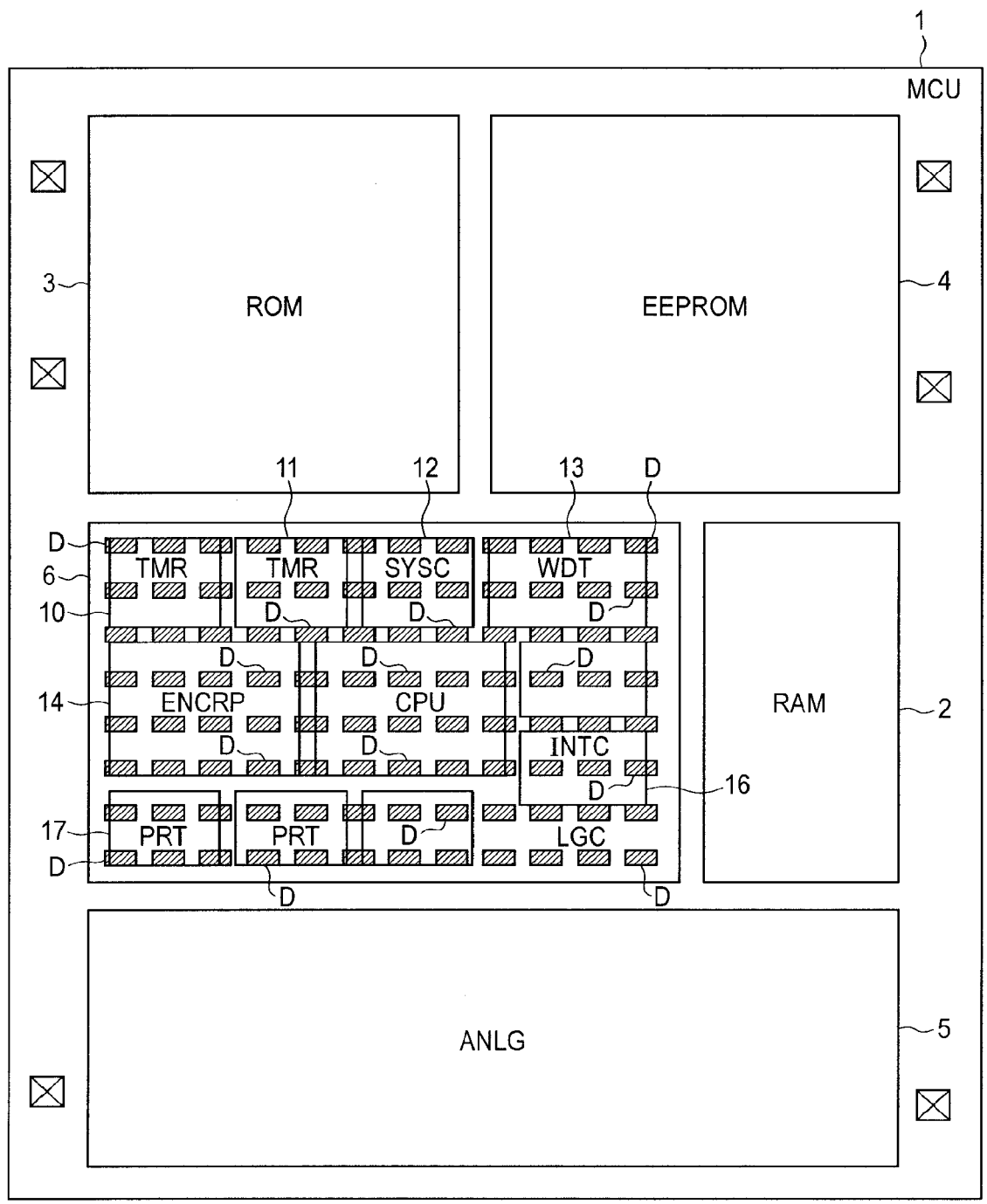
FIG. 2 is a block diagram illustrating the microcomputer according to the preferred embodiment 1 of the present invention.

Referring to FIG. 2, there is shown a block diagram of a microcomputer (MCU) 1 according to a preferred embodiment 1 of the present invention. The microcomputer 1 shown in FIG. 2 is an exemplary semiconductor integrated circuit concerned with the present invention, and for example, the microcomputer 1 is formed over a single semiconductor substrate made of single-crystal silicon or the like by such a semiconductor device manufacturing technique as a complementary MOS integrated circuit fabrication technique.

The microcomputer 1 is used as a so-called IC-card microcomputer that is specifically applied to secure processing such as user authentication, though not particularly limited thereto.

In the microcomputer 1, there are included a mask ROM 3 as a fixed memory device, an EEPROM 4 as an electrically rewritable nonvolatile memory device, and a RAM 2 as a volatile memory device, though not particularly limited thereto. The microcomputer 1 further includes a logic circuit (LGC) 6 for carrying out data processing operations by using information held in these memory devices, and an analog circuit (ANLG) 5 for performing analog processing operations.

The logic circuit 6 comprises a central processing unit (CPU) 15 for carrying out programs stored in the ROM 3 or EEPROM 4 by using the RAM 2 as a work area, an interrupt controller (INTC) 16, a system controller (SYSC) 12, a watchdog timer (WDT) 13, an encryption module (ENCRP) 14, timers (TMR) 10 and 11, and external interface ports (PRT) 17 and 18, though not particularly limited thereto.

The microcomputer 1 is provided with external interface terminals, which include a power supply terminal Pvdd, a ground terminal Pvss, a clock terminal Pclk, a reset terminal Prst, an IO terminal Pio, and an extension terminal Pext. The clock terminal Pclk, the reset terminal Prst, the IO terminal Pio, and the extension terminal Pext are coupled to the external interface ports (17, 18).

The logic circuit 6, the analog circuit 5, the RAM 2, the ROM 3, and the EEPROM 4 are coupled to an internal bus not shown in FIG. 2.

The logic circuit 6 comprises a plurality of photodetector elements D that are distributively disposed therein. The photodetector element D is a semiconductor element in which a current flows through a reverse-biased pn junction upon receipt of light irradiation. More specifically, in a case where light is applied toward a reverse-biased depletion layer at the pn junction of the photodetector element D, there will occur a condition in which a photon having an adequately high level of energy (a substantially short wavelength) collides with a valence electron in a semiconductor, causing the valence electron to be excited to become a free electron. A point having a positive charge due to removal of the valence electron serves as a hole. That is, the incidence of light produces a pair of a hole and a free electron. The hole produced is accelerated by an electric field to migrate to a p-type semiconductor region, while the free electron produced migrates to an n-type semiconductor region. As long as the incidence of light persists, holes and free electrons are continuously produced in pairs. Hence, with light irradiation, a current flows through the reverse-biased pn junction. Under a condition where an electric field applied to the depletion layer is sufficiently intense and most of holes and free electrons in pairs migrate from the depletion layer without recombination thereof, the amount of current is proportional to the number of impinging photons. That is, if the photodetector element D is irradiated with considerably intense light, a large current may be forced to flow through the reverse-biased pn junction thereof, thereby causing a malfunction or faulty condition to occur anywhere in the circuitry concerned. In a situation where a malfunction or faulty condition is thus induced intentionally, information not to be revealed in principle may be output. In such an illegal attack attempt as IC-card hacking, the information thus output might be analyzed by a statistical technique or the like.

The following describes a circuit configuration arranged for detecting light irradiation by using photodetector elements D for the purpose of providing protection against a fault-based attack that is attempted to illegally obtain secret information through intentional induction of a malfunction or faulty condition.

<Inverter-Type Photodetector Element>

Figure 3:
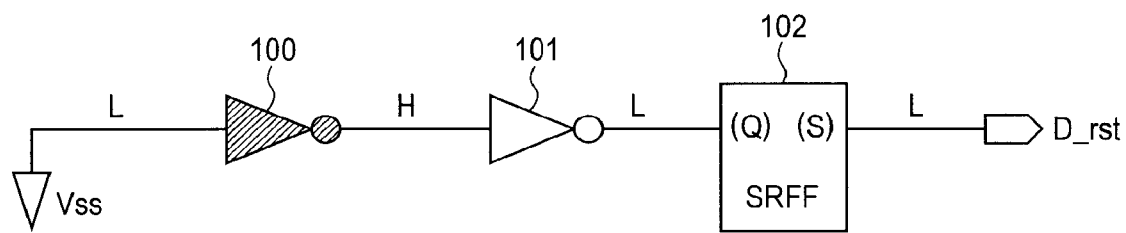
FIG. 3 is a logic circuit diagram for explaining the principle of operation in an instance where a CMOS inverter is used as a photodetector element D.
Figure 4:
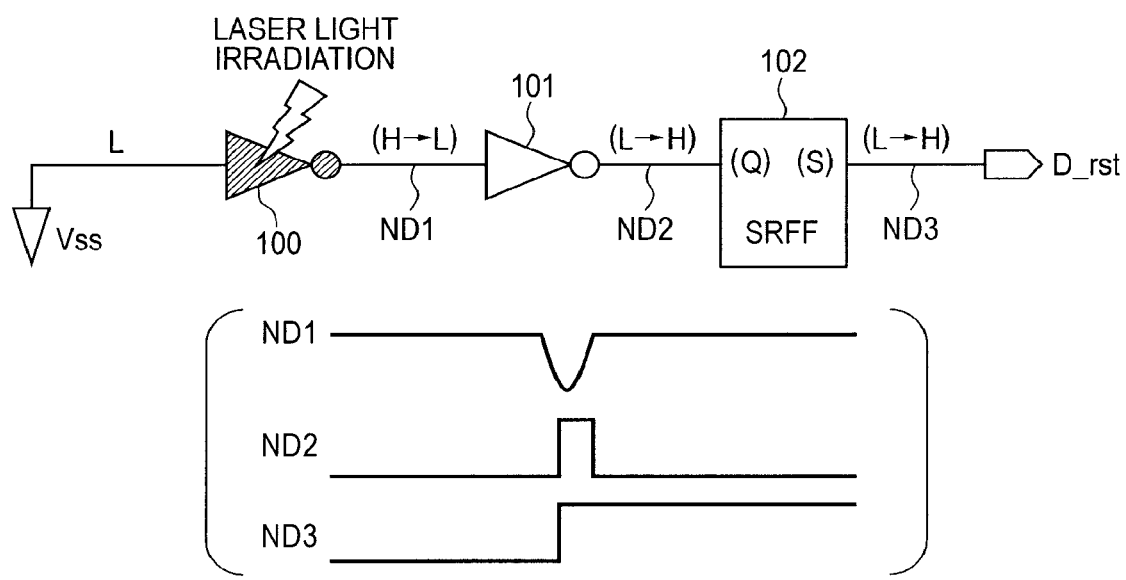
FIG. 4 is an explanatory diagram illustrating operations to be performed when laser light is applied locally to the CMOS inverter.

As a photodetector element D, a CMOS inverter 100 shown in FIG. 3 is applicable, for example. The principle of operation in the use of the CMOS inverter 100 is explained below. In a case where an input terminal of the CMOS inverter 100 is coupled to a ground voltage Vss as shown in FIG. 3, an output thereof has a high level (H). Through a logic-matching inverter 101 located at a stage posterior thereto, a low level is applied to a set terminal of a set/reset-type flip-flop (SRFF) 102. This condition is provided as an initial state. Thereafter, when laser light is applied locally to the CMOS inverter 100, a current flows through a reverse-biased pn junction in the CMOS inverter 100 as shown in FIG. 4, causing the output thereof to be inverted to a low level (L). This high-to-low-level output inversion sets the flip-flop 102 so as to turn an output D_rst thereof to a high level. Thus, laser light irradiation is detected.

Figure 5:
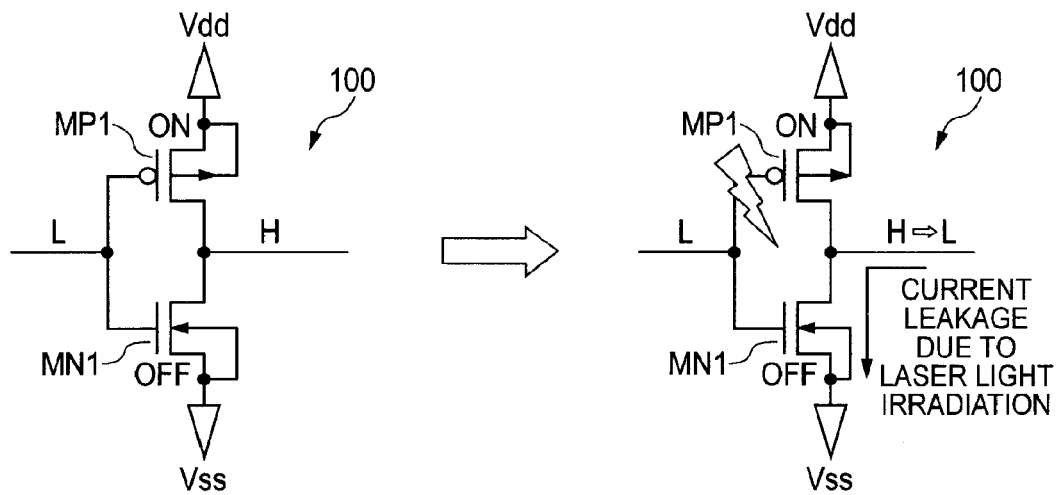
FIG. 5 is a circuit diagram showing a change in output from the CMOS inverter in response to laser light irradiation under a condition where a low-level input is set in an initial state of the CMOS inverter.
Figure 6:
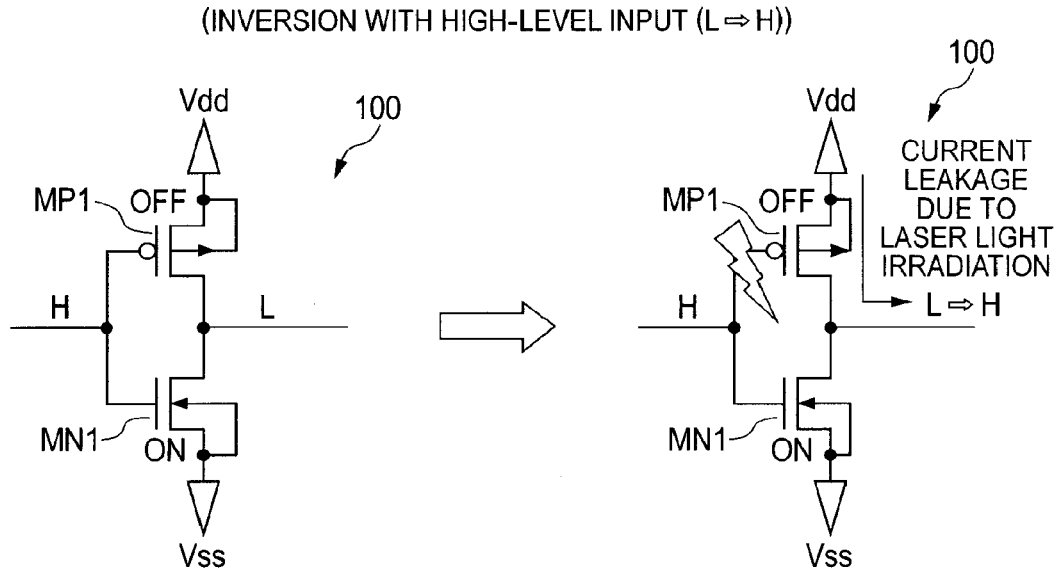
FIG. 6 is a circuit diagram showing a change in output from the CMOS inverter in response to laser light irradiation under a condition where a high-level input is set in an initial state of the CMOS inverter.

Referring to FIG. 5, there is illustrated a change in output from the CMOS inverter 100 having a low-level input at the time of laser light irradiation. In the CMOS inverter 100 in the initial state, a p-channel MOS transistor (PMOS) MP1 thereof is turned on (in the ON state), and an n-channel MOS transistor (NMOS) MN1 is turned off (in the OFF state). With laser light irradiation, a leak current is produced in the n-channel MOS transistor MN1 through a path from an output terminal thereof to a ground terminal Vss via a substrate side thereof, causing an output inversion from a high level to a low level. FIG. 6 shows a change in output from the CMOS inverter 100 at the time of laser light irradiation in a case where a high-level input is applied in an initial state. In this case, with laser light irradiation, a leak current is produced in the p-channel MOS transistor MP1 through a path from a power supply voltage terminal Vdd to an output terminal thereof via a substrate side thereof, causing an output inversion from a low level to a high level.

Figure 7:
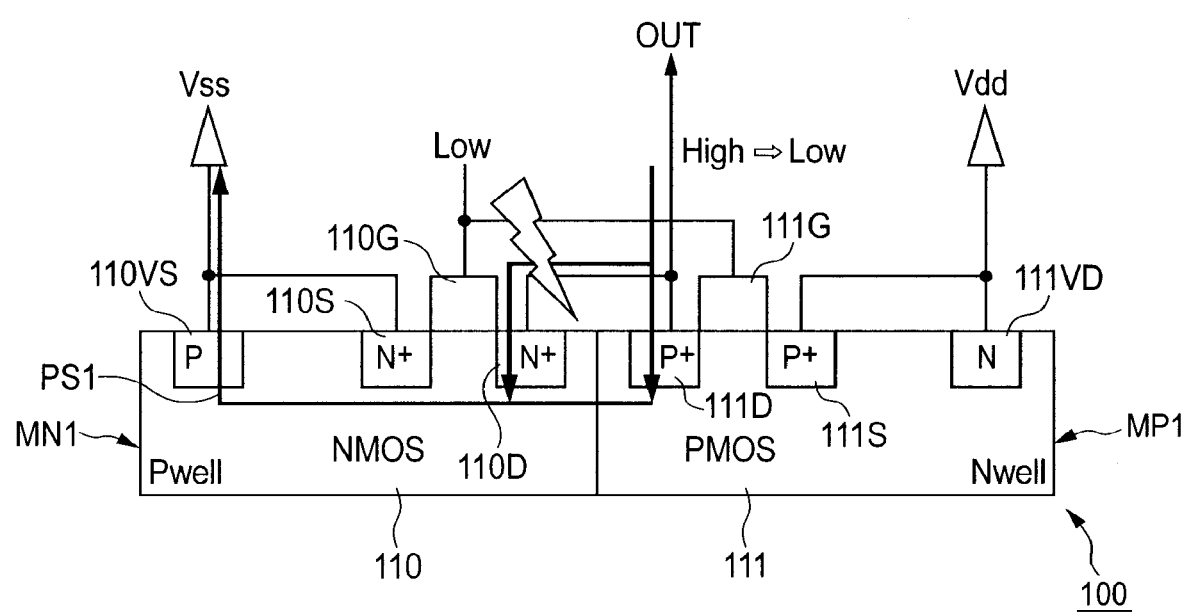
FIG. 7 a longitudinal sectional view of a device structure indicating a leak current path to be provided in the CMOS inverter at the time of laser light irradiation.

Referring to FIG. 7, there is shown a longitudinal sectional view of a device structure, which indicates a leak current path to be provided in the CMOS inverter at the time of laser light irradiation. The leak current path indicated in FIG. 4 is formed at the time of a high-to-low-level output inversion due to laser light irradiation under a condition where a low-level input voltage is applied to gate electrodes 110G and 111G contained in the CMOS inverter used as a photodetector element D. In FIG. 7, reference numeral 110 indicates a p-type well region (Pwell) wherein the MOS transistor MN1 is disposed. In the p-type well region 110, an n-type source electrode 110S and an n-type drain electrode 110D are formed, and also a p-type power feeding region 110VS is formed. The gate electrode of the MOS transistor MN1 is identified by 110G. Further, reference numeral 111 indicates an n-type well region (Nwell) wherein the MOS transistor MP1 is disposed. In the n-type well region 111, a p-type source electrode 111S and a p-type drain electrode 111D are formed, and also an n-type power feeding region 111VD is formed. The gate electrode of the MOS transistor MP1 is identified by 111G. A high-level output OUT in the initial state is turned to a low level at the time of laser light irradiation. With laser light irradiation, a current leakage occurs at each of a reverse-biased pn junction between the p-type well region 110 and the n-type well region 111, a reverse-biased pn junction between the n-type well region 111 and the drain electrode 111D, and a pn junction between the p-type well region 110 and the drain electrode 110D. Thus, through a path PS1, a current flows from an output terminal OUT to the ground terminal Vss. This current corresponds to a current fed from the power supply voltage terminal Vdd to the output terminal OUT via the p-channel MOS transistor MP1 in the ON state. If the amount of current fed via the p-channel MOS transistor MP1 in the ON state is substantially smaller than the amount of current leaking at each reverse-biased pn junction, the high-level output OUT in the initial state is immediately inverted to a low level. That is, in this respect, sensitivity to laser light irradiation can be enhanced by reducing the amount of current fed via the p-channel MOS transistor MP1 in the ON state, which will be described in detail later.

Figure 8:
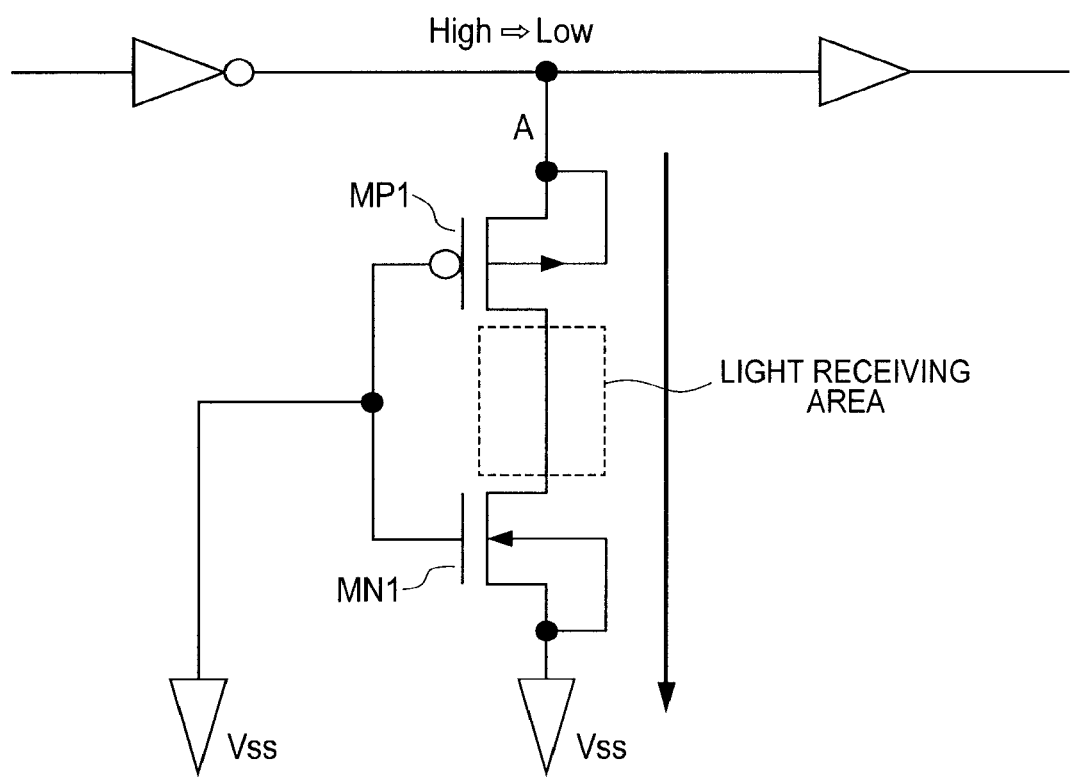
FIG. 8 is a circuit diagram showing a comparative example circuit where the CMOS inverter is used functionally as a diode.
Figure 9:
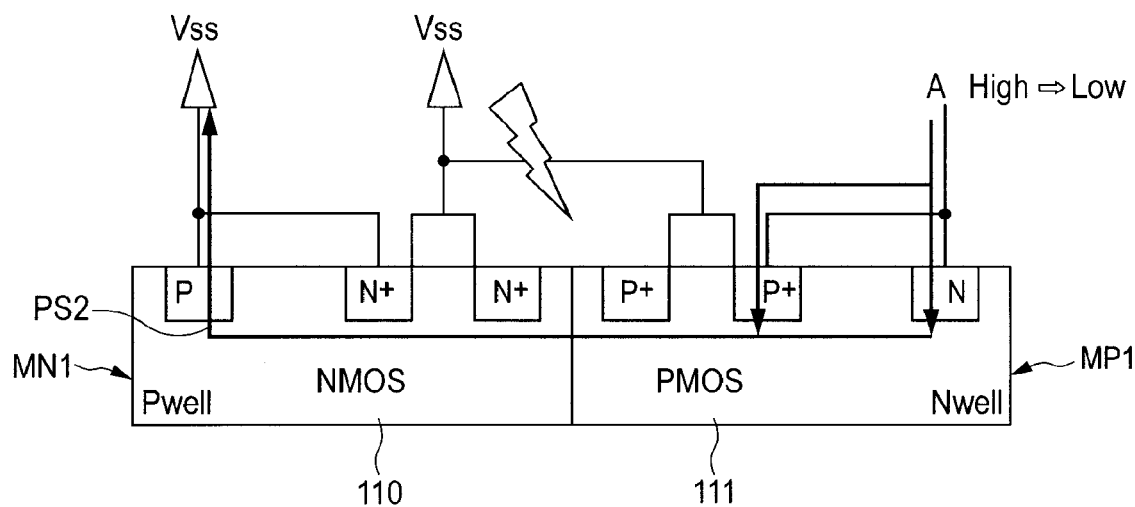
FIG. 9 is a longitudinal sectional view of the circuit shown in FIG. 8.

Referring to FIG. 8, there is shown a comparative example circuit in which the CMOS inverter is used functionally as a diode. In the initial state, the MOS transistor MN1 is turned off (in the OFF state), for instance. FIG. 9 shows a longitudinal sectional view of this comparative example circuit. In this case, with laser light irradiation, a current leakage occurs only at the reverse-biased pn junction between the p-type well region 110 and the n-type well region 111. As compared with the case shown in FIG. 7, the amount of current leaking at the reverse-biased pn junction is relatively small at the time of laser light irradiation. Hence, in a circuit configuration where the CMOS inverter 100 is arranged in series with the signal path as shown in FIG. 7, it is possible to provide higher sensitivity to laser light irradiation with ease.

<Reduction in Power Feeding Capacity>

Figure 10:
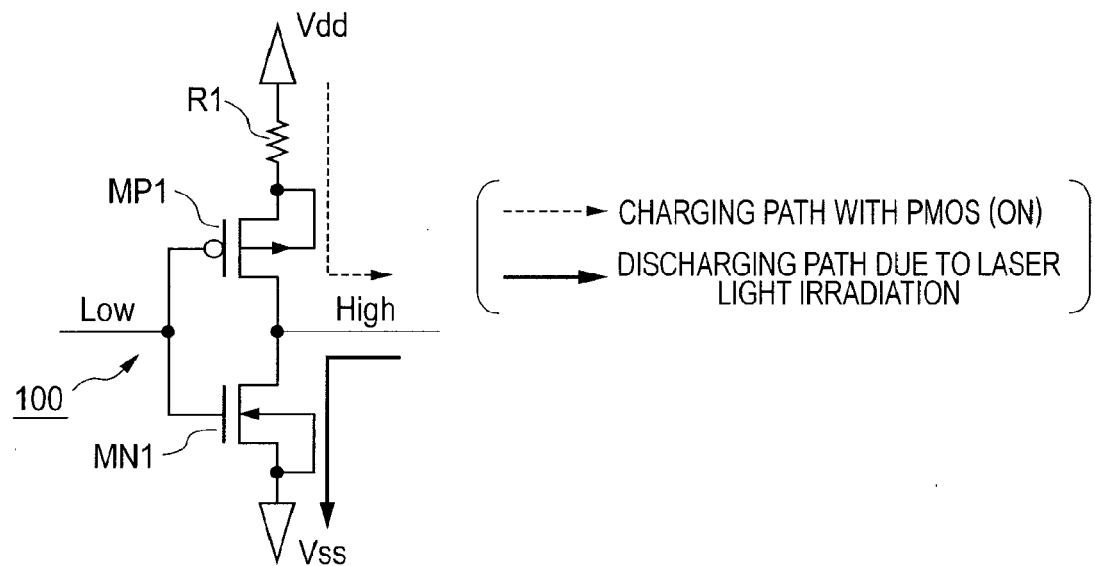
FIG. 10 is a circuit diagram illustrating an exemplary CMOS inverter circuit wherein a resistor is coupled for enhancement in detection sensitivity to laser light irradiation.
Figure 11:
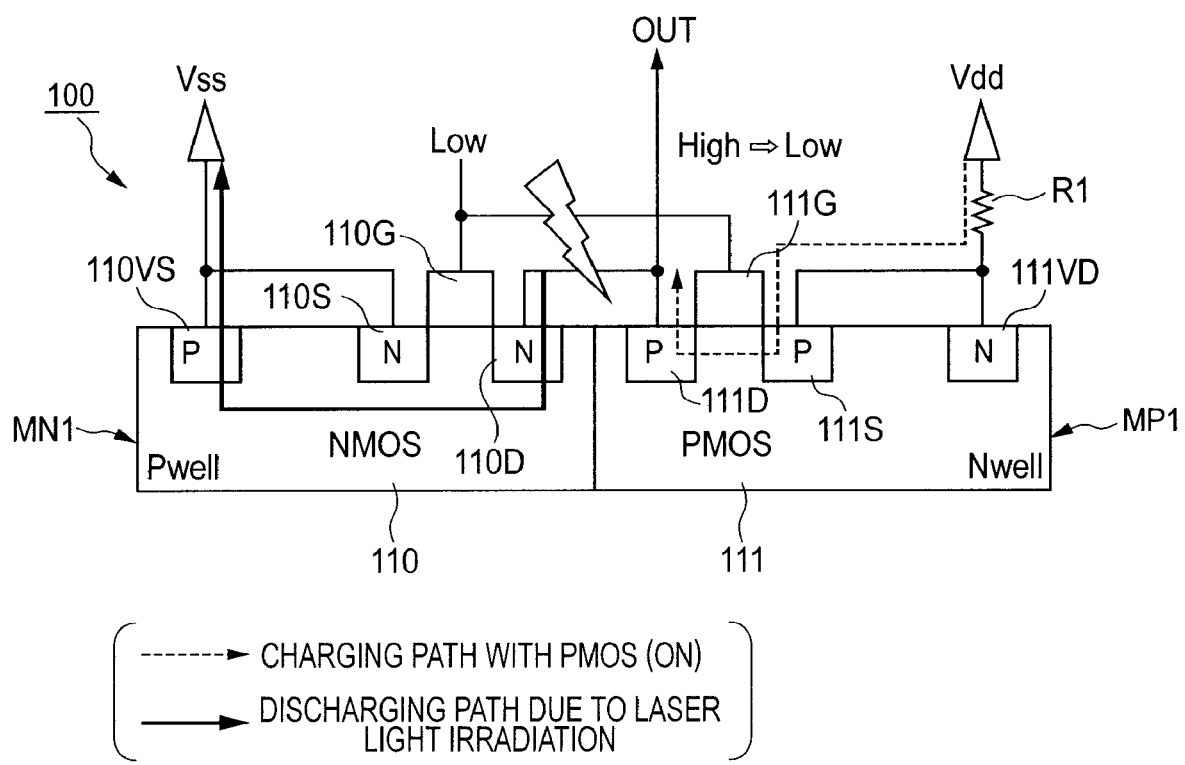
FIG. 11 is a longitudinal sectional view of a device structure corresponding to the circuit shown in FIG. 10.

Referring to FIG. 10, there is shown an exemplary circuit of the CMOS inverter 100 configured for enhancement in detection sensitivity to laser light irradiation. FIG. 11 shows a longitudinal section view of a device structure corresponding to the exemplary circuit shown in FIG. 10. In the CMOS inverter used as a photodetector element D, a low-level input voltage is applied to the gate electrodes 110G and 111G of the p-channel MOS transistor MP1 and the n-channel MOS transistor MN1. When a high-level output is inverted to a low level due to laser light irradiation, a leak current path is provided as shown in FIGS. 10 and 11. In this case, it is assumed that the CMOS inverter 100 is used to provide a high-level output in the initial state. A resistor element R1 is coupled to the source electrode of the p-channel MOS transistor MP1 so that the amount of charge current from the p-channel MOS transistor MP1 in the ON state is reduced with respect to the amount of leak current due to laser light irradiation. That is, the capacity of power feeding from the p-channel MOS transistor MP1 is reduced. Thus, a high-to-low-level output inversion is performed faster in response to laser light irradiation, thereby contributing to further enhancement in sensitivity to laser light irradiation. It is to be noted that the capacity of power feeding from the p-channel MOS transistor MP1 may also be reduced by decreasing the physical size of the p-channel MOS transistor MP1 itself.

Figure 12:
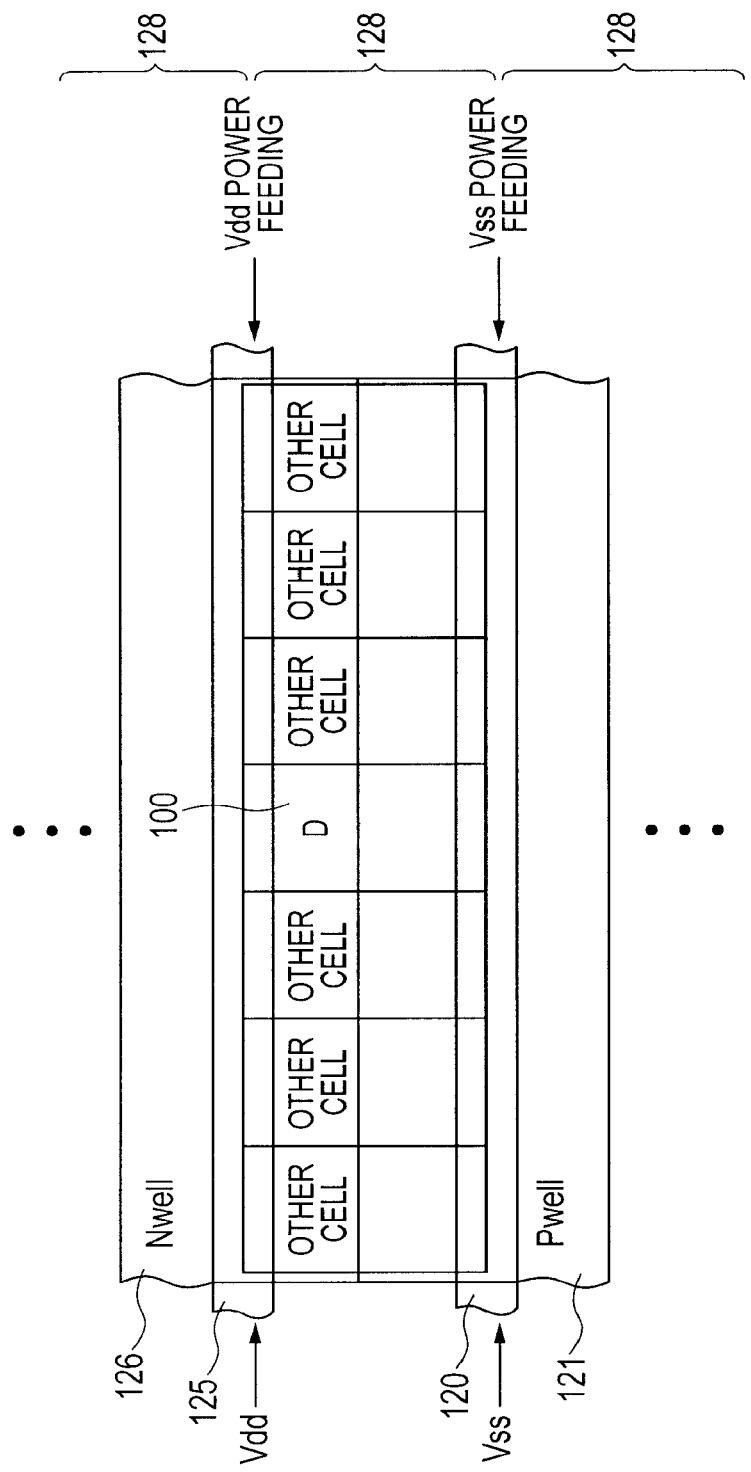
FIG. 12 is a plan view showing an exemplary layout of power feeding to the photodetector element D and other cells (logic circuit cells)

Referring to FIG. 12, there is shown an exemplary layout for the resistor element R1. In the CMOS semiconductor integrated circuit, various circuits are formed in a semiconductor region 128 having a predetermined height dimension wherein a p-type well region 121 receiving power from a ground line 120 is in juxtaposition with an n-type well region 126 receiving power from a power supply line 125. In the semiconductor region 128, the CMOS inverter 100 used as a photodetector element D and other circuits are formed adjacently. In this arrangement, if the resistor element R1 is disposed in a path from a power bus line (not shown) to the power supply line 125, a PMOS current driving capacity is decreased undesirably in other cell circuits as well as in the CMOS inverter 100 used as a photodetector element D.

Figure 13:
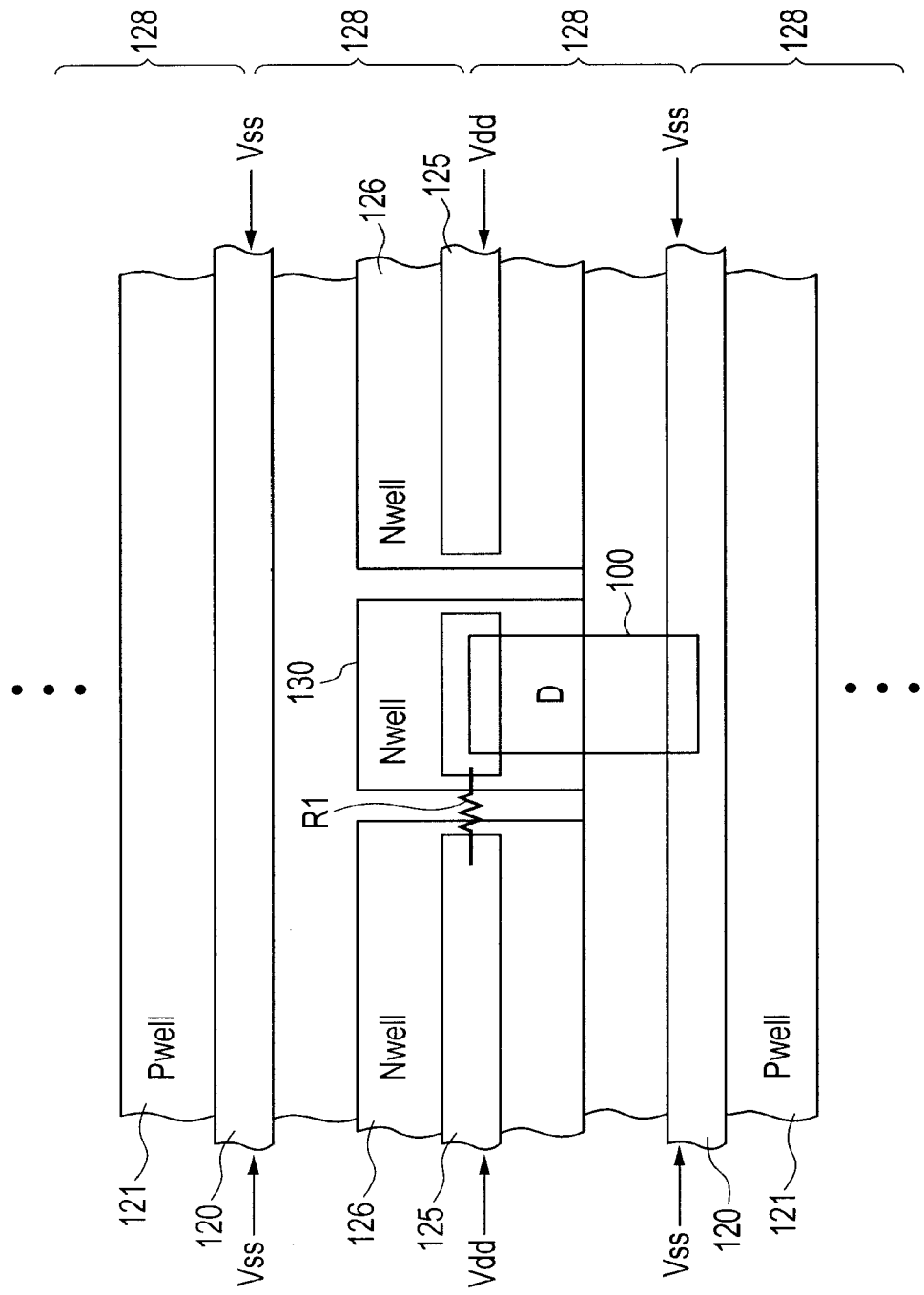
FIG. 13 is a plan view showing an exemplary layout wherein a resistor element R1 is disposed with respect to power feeding to the photodetector element D in a preferable fashion for suppressing a decrease in PMOS current driving capacity in the other cells.

Referring to FIG. 13, there is shown an exemplary layout wherein the resistor element R1 is disposed in a preferable fashion for suppressing a decrease in PMOS current driving capacity in the other cell circuits. More specifically, in the n-type well region 126 extending transversely, an n-type region 130 containing the p-channel MOS transistor MP1 is isolated therefrom intermediately. For each n-type well region 126 isolated from the n-type well region 130, power is fed from each of the left and right power bus lines to each power supply line 125. For the n-type well region 130, power is fed via the resistor element R1 from a power supply line 125 formed in the isolated n-type well region 126. Hence, in a case where the resistor element R1 is disposed for enhancement in light detection sensitivity of the CMOS inverter 100, there occurs no adverse effect on power feeding to the n-type well region 126 containing the PMOS inverter formed in the logic circuit.

Figure 14:
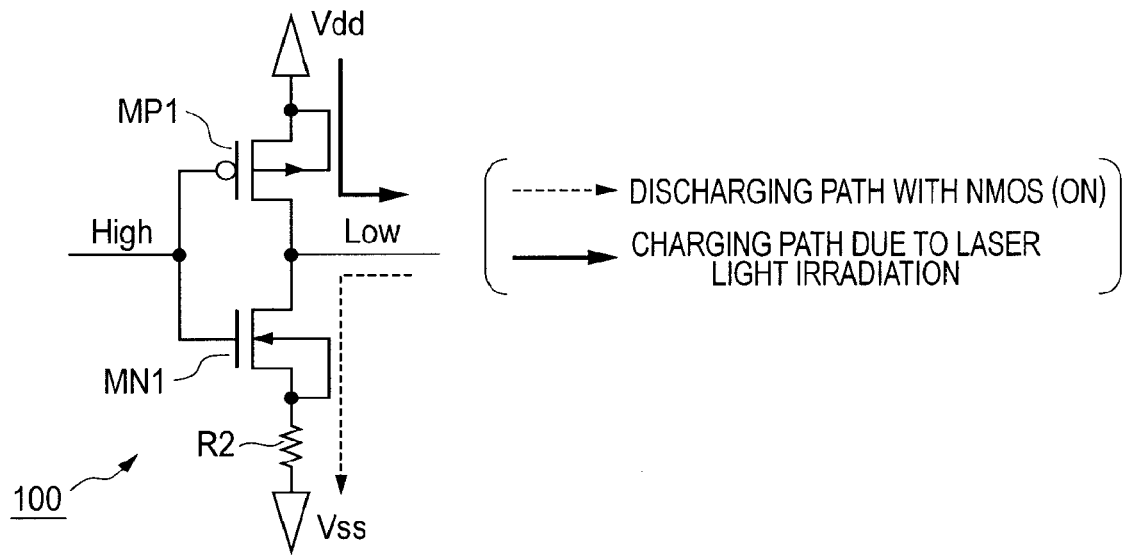
FIG. 14 is a circuit diagram illustrating another exemplary CMOS inverter circuit arranged so as to enhance detection sensitivity to laser light irradiation.
Figure 15:
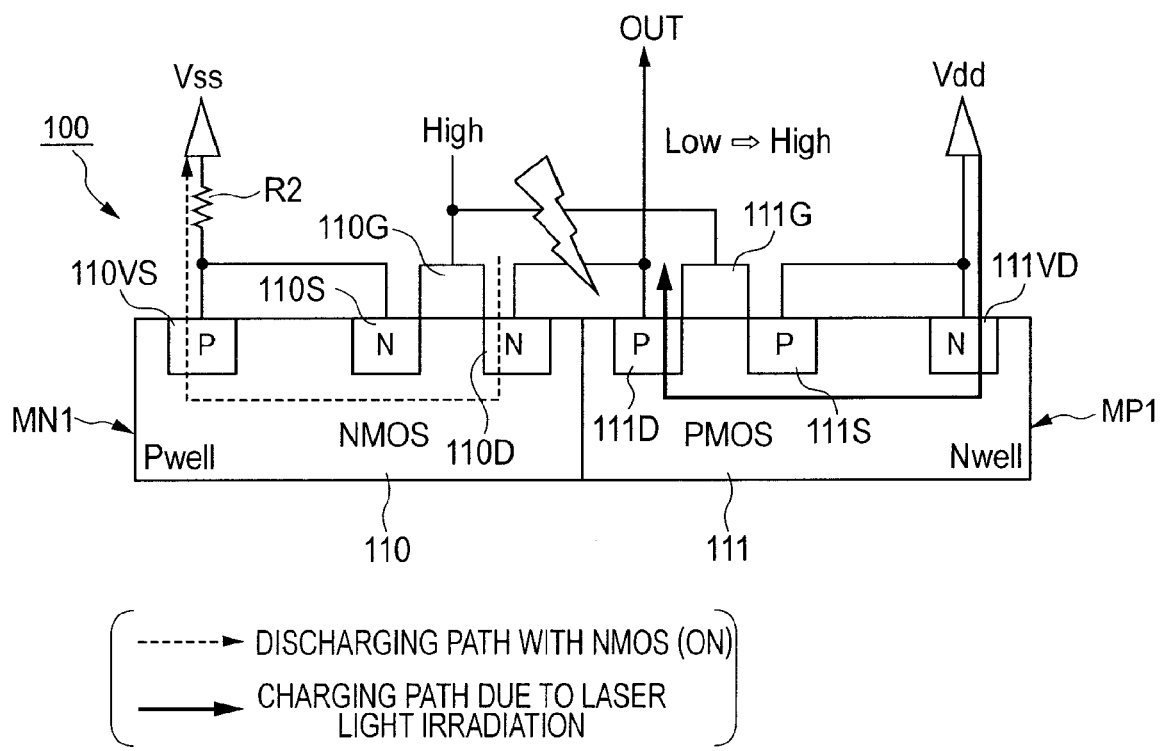
FIG. 15 is a longitudinal sectional view of a device structure corresponding to the circuit shown in FIG. 14.

Referring to FIG. 14, there is shown another exemplary circuit of the CMOS inverter 100 configured for enhancement in detection sensitivity to laser light irradiation. FIG. 15 shows a longitudinal sectional view of a device structure corresponding to the exemplary circuit illustrated in FIG. 14. In the CMOS inverter used as a photodetector element D, a high-level input voltage is applied to the gate electrodes 110G and 111G of the p-channel MOS transistor MP1 and the n-channel MOS transistor MN1. When a low-level output is inverted to a high level due to laser light irradiation, a leak current path is provided as shown in FIGS. 14 and 15. In this case, it is assumed that the CMOS inverter 100 is used to provide a low-level output in the initial state. A resistor element R2 is coupled to the source electrode of the n-channel MOS transistor MN1 so that the amount of discharge current from the n-channel MOS transistor MN1 in the ON state is reduced with respect to the amount of leak current due to laser light irradiation. That is, the capacity of power feeding from the n-channel MOS transistor MN1 is reduced. Thus, a low-to-high-level output inversion is performed faster in response to laser light irradiation, thereby contributing to further enhancement in sensitivity to laser light irradiation. It is to be noted that the capacity of power feeding from the re-channel MOS transistor MN1 may also be reduced by decreasing the physical size of the n-channel MOS transistor MN1 itself.

Figure 16:
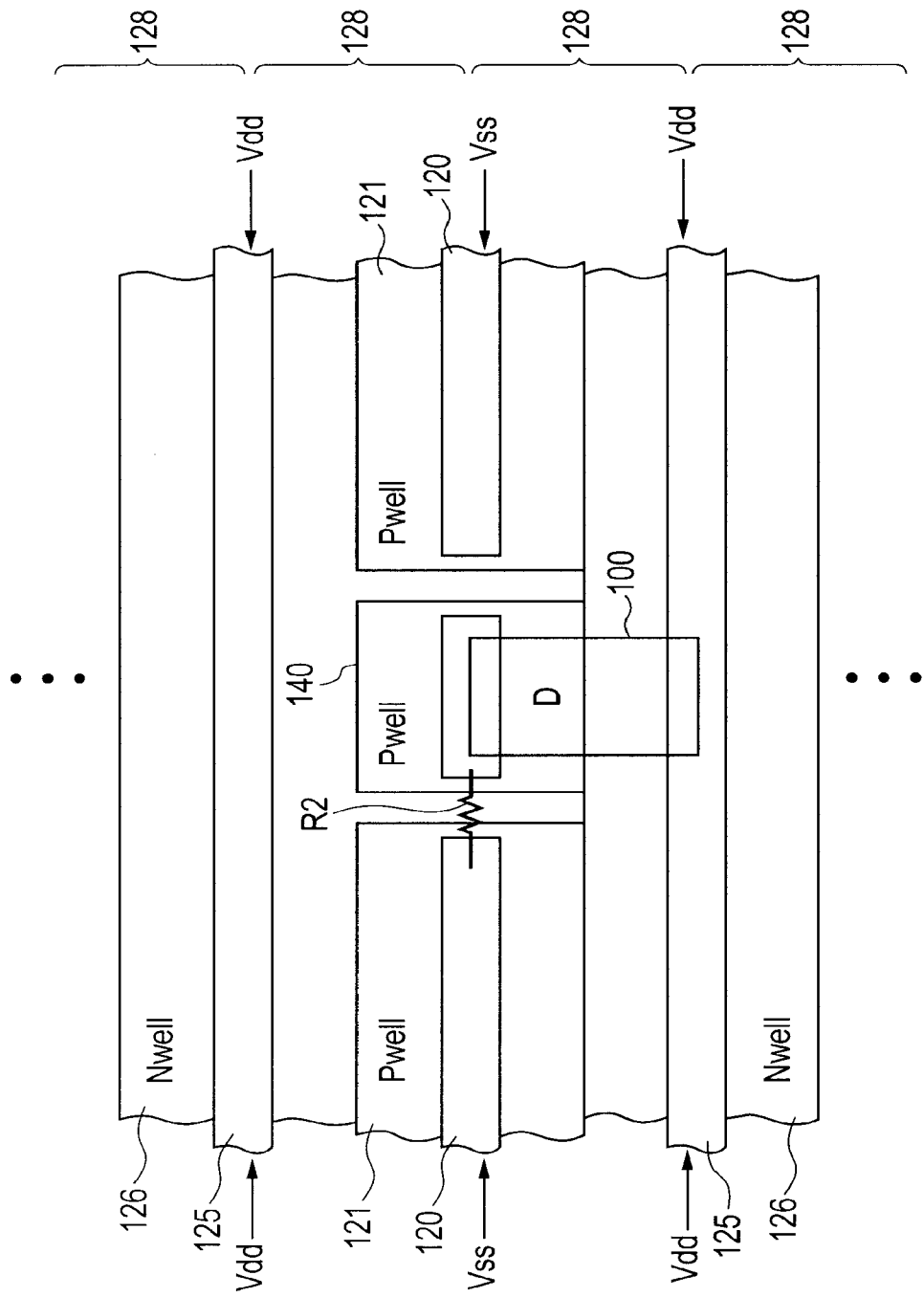
FIG. 16 is a plan view showing an exemplary layout wherein a resistor element R2 is disposed.

Referring to FIG. 16, there is shown an exemplary layout for the resistor element R2. In the CMOS semiconductor integrated circuit, various circuits are formed in a semiconductor region 128 having a predetermined height dimension wherein a p-type well region 121 receiving power from a ground line 120 is in juxtaposition with an n-type well region 126 receiving power from a power supply line 125. In the semiconductor region 128, the CMOS inverter 100 used as a photodetector element D and other circuits are formed adjacently. In this arrangement, if the resistor element R2 is disposed in a path from a power bus line (not shown) to the ground line 120, an NMOS current driving (current drawing) capacity is decreased undesirably in other cell circuits as well as the CMOS inverter 100 used as a photodetector element D.

In the exemplary layout shown in FIG. 16, the resistor element R2 is disposed in a preferable fashion for suppressing a decrease in NMOS current driving capacity in the other cell circuits. More specifically, in the p-type well region extending transversely, a p-type well region 140 is isolated therefrom intermediately. For each p-type well region 121 isolated from the p-type well region 140, power is fed from each of the left and right ground bus lines to each ground line 120. For the p-type well region 140, power is fed via the resistor element R2 from a ground line 120 formed in the isolated p-type well region 121. Hence, in a case where the resistor element R2 is disposed for enhancement in light detection sensitivity of the CMOS inverter 100, there occurs no adverse effect on power feeding to the p-type well region 121 containing the NMOS inverter formed in the logic circuit.

<$V_{LT}$ of Buffer Inverter>

Figure 17:
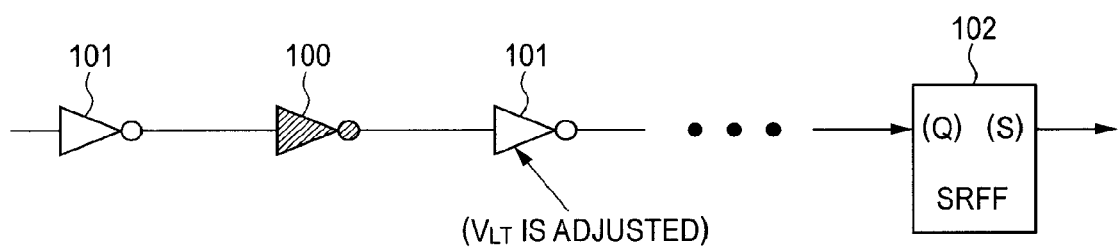
FIG. 17 is a circuit diagram showing a CMOS inverter for polarity matching that is coupled to a photodetector element.

Referring to FIG. 17, there is shown still another exemplary circuit of the CMOS inverter 100 configured for enhancement in detection sensitivity to laser light irradiation. A logical threshold voltage $V_{LT}$ of a polarity-matching inverter 101 (buffer inverter, logic-matching inverter) located at a stage posterior to the CMOS inverter 100 is determined according to an output level of the CMOS inverter 100 in the initial state. In a case where the CMOS inverter 100 provides a high-level output in the initial state, the logical threshold voltage $V_{LT}$ of the polarity-matching inverter 101 is increased. For example, there is adopted such an arrangement that the size of the p-channel MOS transistor is increased while the size of the n-channel MOS transistor is decreased. Thus, when the high-level output of the CMOS inverter 100 is inverted to a low level in response to laser light irradiation, the polarity-matching inverter 101 performs a fast output inversion thereof. Alternatively, in a case where the CMOS inverter 100 provides a low-level output in the initial state, the logical threshold voltage $V_{LT}$ of the polarity-matching inverter 101 is decreased. For example, there is adopted such an arrangement that the size of the p-channel MOS transistor is decreased while the size of the n-channel MOS transistor is increased. Thus, when the low-level output of the CMOS inverter 100 is inverted to a high level in response to laser light irradiation, the polarity-matching inverter 101 performs a fast output inversion thereof. In the manner mentioned above, it is possible to enhance detection sensitivity to laser light irradiation.

<Inverter Series-Coupling Layout>

Referring to FIG. 1, there is shown a circuit configuration wherein a multiplicity of CMOS inverters 100 used as detection inverters are coupled in series. In FIG. 1, it is assumed that a plurality of partial circuit regions represented by partial circuit regions 151 and 152 are provided in a region for the logic circuit 6, for example. In each of the partial circuit regions 151, 152, and so forth, there are distributively disposed a plurality of series-coupled CMOS inverters 100 that are arranged to have a constant logical value of primary-stage input, e.g., a high-level logical value "1". As described above with reference to FIG. 3, a multiplicity of pairs of CMOS inverters 100 and logic-matching inverters 101 may be coupled in series. Alternatively, without using the logic-matching inverters 101, a multiplicity of CMOS inverters 100 only may be disposed. In a case where a multiplicity of pairs of CMOS inverters 100 and logic-matching inverters 101 are coupled in series, it is just required to employ an arrangement wherein power feeding capacity is reduced by using either one of the resistor elements R1 and R2 for each CMOS inverter 100. Hence, for implementation of such a well-region-isolated configuration as described with reference to FIGS. 13 and 16, either p-type or n-type well region only should be isolated, thereby contributing to simplification in layout patterning. Further, it is possible to enhance sensitivity by properly setting up a logical threshold voltage $V_{LT}$ of each buffer inverter (logic-matching inverter) 101. Alternatively, in a case where the buffer inverters 101 are not used, it is allowed to dispose a multiplicity of detection inverters arranged to have higher detection sensitivity through reduction in power feeding capacity by using the resistor element R1 or R2 for each detection inverter. It is to be noted, however, that there arises an increase in the complexity of layout patterning and that sensitivity enhancement by logical threshold voltage setting in each buffer inverter 101 is not applicable. In this case, sensitivity enhancement can be made by providing an arrangement wherein a logical threshold voltage of the CMOS inverter serving as a detection inverter is determined based on comparison with that of the inverter included in the logic circuit. That is, in a case where a low-level input is applied to the CMOS inverter serving as a detection inverter, the logical threshold voltage is decreased. Alternatively, in a case where a high-level input is applied to the CMOS inverter serving as a detection inverter, the logical threshold voltage is increased. Thus, it is possible to enhance detection sensitivity to laser light irradiation. Further, the logical threshold voltage of the buffer inverter 101 located at a stage posterior to the detection inverter 100 that outputs a high level in a state prior to light irradiation is set to be higher than the logical threshold voltage of the inverter included in the logic circuit. Thus, in the detection inverter wherein an output potential thereof decreases at the time of light irradiation, it is possible to enhance detection sensitivity with respect to output variations.

As regards the formation of a series circuit of CMOS inverters 100 in each of the partial circuit regions 151, 152, and so forth, a flip-flop SRFF 102 serving as a detection circuit for detecting an input logical value inversion due to an output inversion of the CMOS inverter 100 at the time of light irradiation is disposed in a partial circuit region different from a partial circuit region containing the series circuit of CMOS inverters 100 coupled with the flop-flop SRFF 102. That is, a signal D1_det obtained at the last stage of the series circuit of CMOS inverters 100 in the partial circuit region 151 is fed to a set terminal (S) of a flip-flop SRFF 102 disposed in the partial circuit region 152, causing the flip-flop SRFF 102 to produce a signal D1_rst from an output terminal (Q) thereof. Likewise, a signal D2_det obtained at the last stage of the series circuit of CMOS inverters 100 in the partial circuit 152 is fed to a set terminal (S) of a flip-flop SRFF 102 disposed in the partial circuit region 151, causing the flip-flop SRFF 102 to produce a signal D2_rst from an output terminal (Q) thereof. Thus, it is possible to prevent the occurrence of a malfunction in each flip-flop SRFF 102 due to local light irradiation.

Figure 18:
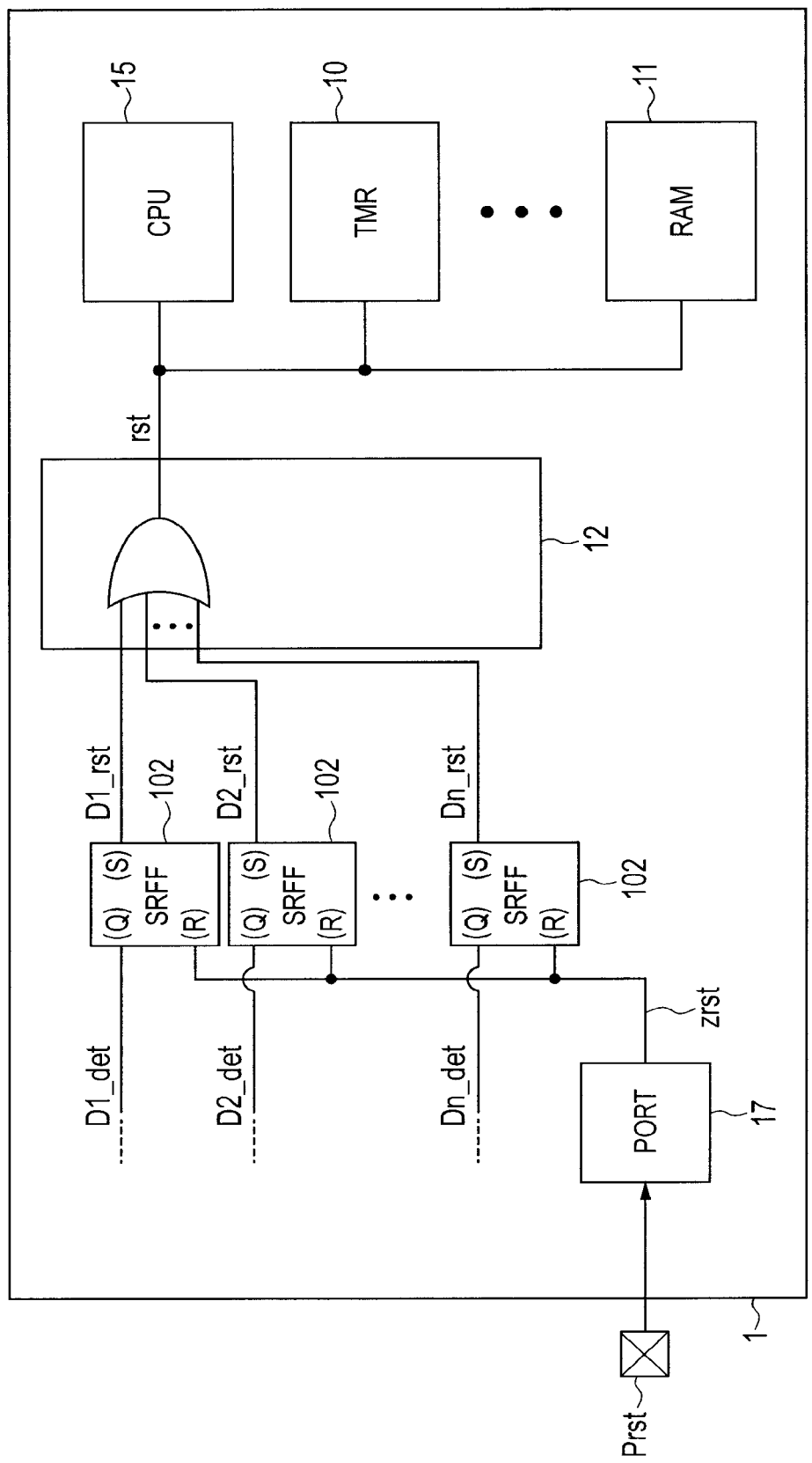
FIG. 18 is a circuit diagram showing an exemplary logic circuit wherein control operation is performed using detection signals D1_rst to Dn_rst.

Referring to FIG. 18, there is shown an exemplary logic circuit 6 wherein control operation is performed using detection signals D1_rst to Dn_rst. It is assumed that there are provided "n" partial circuit regions in the logic circuit 6. In each of the partial circuit regions, each of the signals D1_det to Dn_det is obtained at the last stage of the series circuit of CMOS inverters 100 (e.g., a high-level signal is obtained upon detection of laser light irradiation). Each of the signals D1_det to Dn_det thus obtained is fed to the set terminal (S) of the corresponding flip-flop SRFF 102. Then, from the output terminal (Q) of each flip-flop SRFF 102, each of detection signals D1_rst to Dn_rst is fed to a reset control logic circuit of the system controller 12. In the reset control logic circuit of the system controller 12, a logical OR operation is performed to produce an internal reset signal rst. The internal reset signal rst thus produced is supplied to internal circuits such as the CPU 15, TMR 10, and RAM 11. For example, an initialization operation is instructed by a high-level state of the internal reset signal rst. The reset control logic circuit of the system controller 12 is an example of a limiter circuit for imposing limitation on operation of the logic circuit 6 in response to a logical value inversion detected as an output from the flip-flop SRFF 102 serving as a detection circuit.

On the other hand, there is provided an internal reset signal zrst which turns from a low level to a high level in response to a low-to-high-level inversion applied from the reset terminal Prst to the port 17. When the internal reset signal zrst is input to a reset terminal (R) of each flip-flop SRFF 102, the internal reset signal rst is negated since each flip-flop SRFF 102 is reset.

Figure 19:
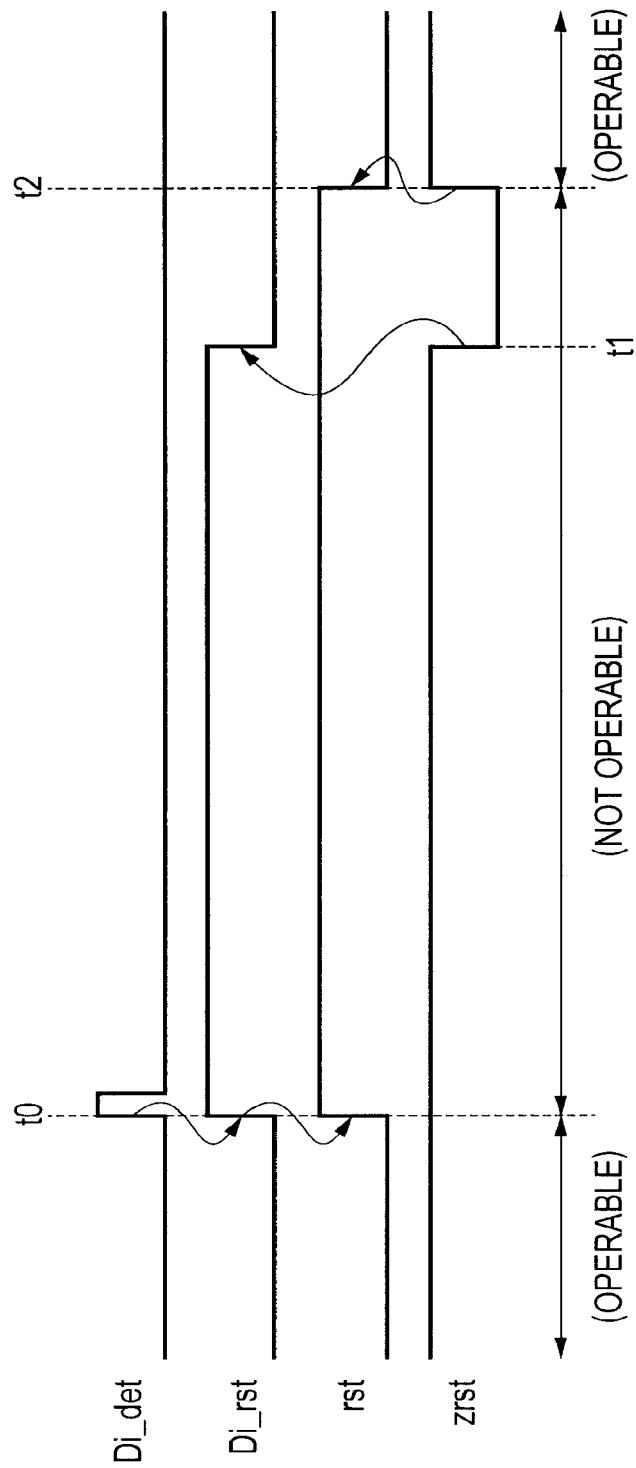
FIG. 19 is a timing chart illustrating an operation timing of the circuit shown in FIG. 18.

Referring to FIG. 19, there is shown an operating timing of the circuit exemplified in FIG. 18. For example, at time point t0, if a signal D1_det produces a high-level pulse in a partial circuit region in response to laser light irradiation, the corresponding flip-flop SRFF 102 is set so as to cause the internal reset signal rst to turn to a high level. Thus, an initialization operation is started in each internal circuit such as the CPU 15 in the logic circuit 6. During a period of the initial operation, an action-after-reset is not allowed in the microcomputer 1, thereby preventing the occurrence of a malfunction to be intentionally induced with laser light irradiation. Thus, protection is provided against illegal tampering with CPU programs and illegal access to secret data stored in the microcomputer 1. Then, the reset terminal Prst is held at a low level for a predetermined time period from time point t1. At time point t2, the reset terminal Prst is turned to a high level to enable operations in the logic circuit 6.

In the exemplary logic circuit shown in FIG. 18, a detection event of laser light irradiation is utilized to issue an internal reset instruction in the microcomputer 1, and thereafter, normal operations are resumed according to an external reset instruction. It is to be noted, however, that the present invention is not limited thereto. There may be provided an arrangement wherein a nonvolatile control bit is programmed to disable microcomputer operations upon detection of laser light irradiation so that normal operations cannot be resumed. Further, there may also be provided an arrangement wherein an auto-destruction by using an excessively high voltage or the like is triggered upon detection of laser light irradiation.

<Kind of Gate>

Figure 20:
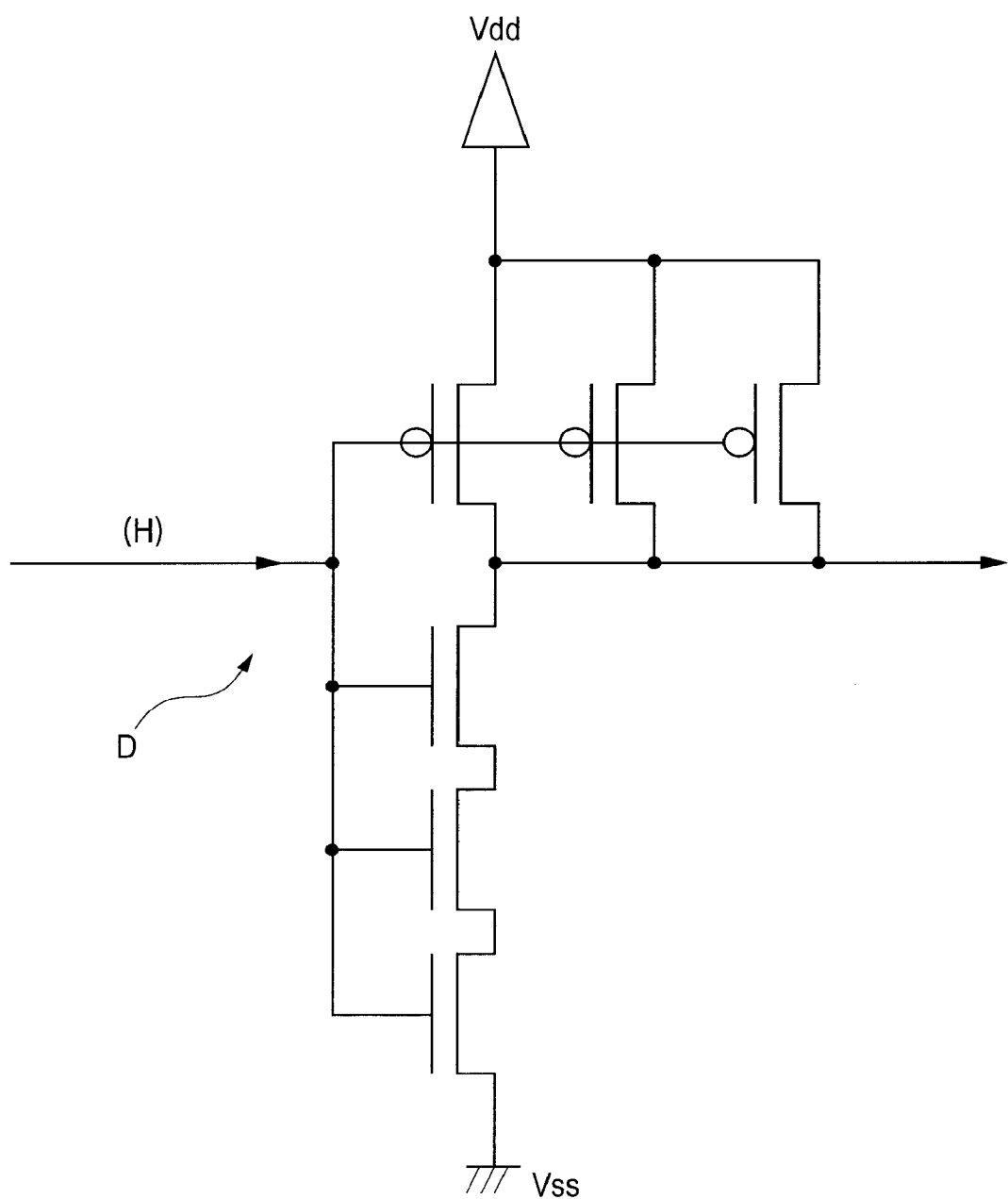
FIG. 20 is a circuit diagram illustrating a detection inverter using a three-input NAND gate.

The detection inverter used as a photodetector element D is not limited to a CMOS inverter. Instead of the CMOS inverters, NAND gates with all inputs thereof coupled in common or NOR gates with all inputs thereof coupled in common may be employed to configure an equivalent circuit. FIG. 20 shows an exemplary detection inverter using a three-input NAND gate. In this example, a high-level input is applied to the three-input NAND gate. To provide a difference in power feeding capacity between the Vdd side and the Vss side, the size of each p-channel MOS transistor is increased while the size of each n-channel MOS transistor is decreased. That is, due to a difference in transistor size, the power feeding capacity on the Vdd side is increased while the power feeding capacity on the Vss side is decreased, thereby making it possible to enhance detection sensitivity. As in the case shown in FIG. 6, detection sensitivity to laser light irradiation is enhanced in the detection inverter having a high-level input applied in the initial state.

Preferred Embodiment 2

Diode Parallel-Coupling Configuration

Figure 22:
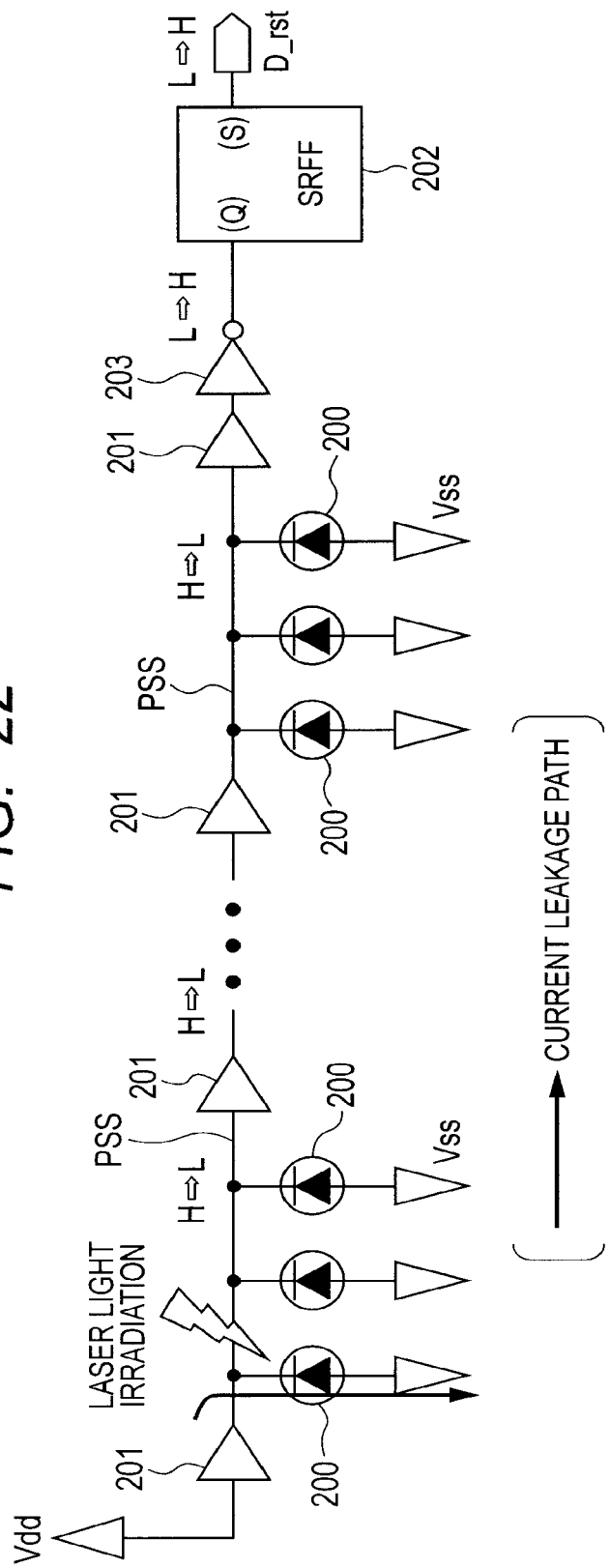
FIG. 22 is a circuit diagram illustrating a basic circuit configuration wherein detection diodes are used as photodetector elements D in the logic circuit.

Referring to FIG. 22, there is shown a basic circuit configuration wherein detection diodes used as photodetector elements D are disposed in parallel in the logic circuit 6.

In a region containing the logic circuit 6, there are distributively disposed a plurality of series-coupled buffers that are arranged to have a constant logical value of primary-stage input, e.g., a high-level logical value "1". A plurality of detection diodes 200 are parallel-coupled in a reverse-biased state between a ground voltage Vss and a signal path PSS extending from an input of one of the buffers 201 to an output of a buffer 201 located at a stage anterior thereto. That is, the cathode of each detection diode 200 is coupled to the signal path PSS, and the anode thereof is coupled to the ground voltage. Reference numeral 203 in FIG. 22 indicates a logic-matching inverter. An inverted signal of an output from the last-stage buffer 201 is fed to a set terminal of a set/reset-type flip-flop (SRFF) 202 as in the case of the preferred embodiment 1 described above, for example. Thus, a logical value inversion output from the buffer 201 is detected when the detection diode 200 is turned to a forward-biased state upon receipt of light irradiation.

Figure 23:
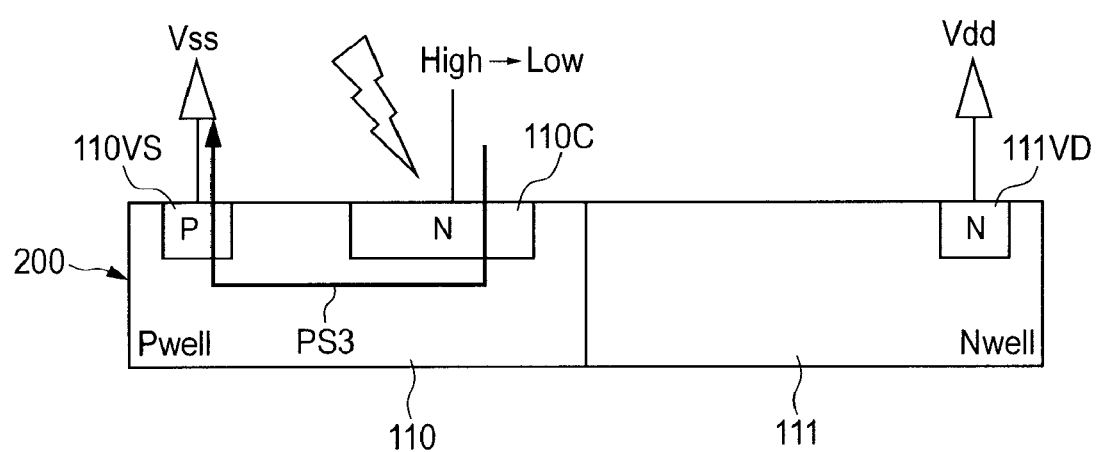
FIG. 23 is a longitudinal sectional view of a detection diode device structure corresponding to the circuit shown in FIG. 22.

As exemplarily shown in FIG. 23 for example, in the detection diode 200, an n-type semiconductor region 110C included in a p-type well region 110 is configured as a cathode, and a p-type well region 110 coupled a p-type power feeding region 110VS is configured as an anode. A reverse-biased pn junction is provided between the p-type well region 110 and the n-type semiconductor region 110C configuring the cathode. In this arrangement, when the detection diode 200 is irradiated with laser light, a current leakage occurs at the reverse-biased pn junction between the p-type well region 110 and the n-type semiconductor region 110C configuring the cathode. Thus, a current flows through a path PS3, causing an inversion to a low level in an input to a buffer 201 located at a stage posterior to the detection diode 200. This inversion sets the flip-flop SRFF 202, thereby producing a high-level detection signal Drst.

Figure 24:
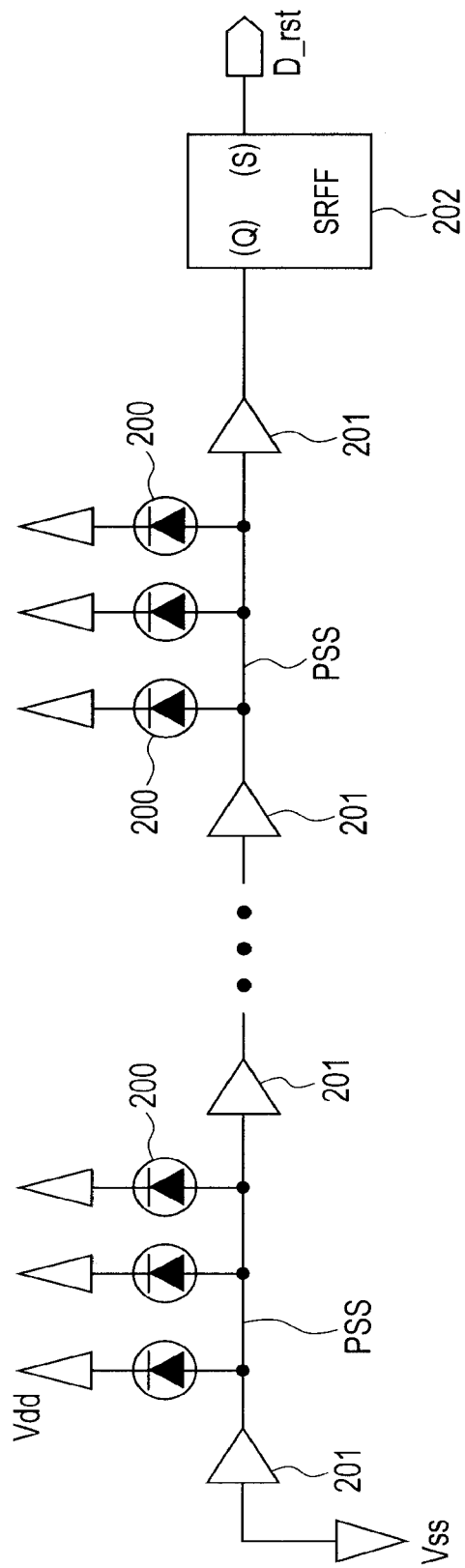
FIG. 24 is a circuit diagram illustrating a circuit configuration wherein detection diodes are coupled in a reverse-biased state with respect to a power supply terminal Vdd.

Referring to FIG. 24, there is shown a circuit configuration wherein the detection diode 200 is coupled in a reverse-biased state with respect to a power supply terminal Vdd. More specifically, an input of the primary-stage buffer 201 is coupled to the ground voltage Vss, the anode of the detection diode 200 is coupled to the signal path PSS extending through a plurality of buffers 201, and the cathode of the detection diode 200 is coupled to a power supply voltage Vdd. In this arrangement, it is not required to provide a logic-matching inverter 203. As exemplarily shown in FIG. 25, in the detection diode 200, a p-type semiconductor region 111A formed in the n-type well region 111 is configured as an anode, and an n-type well region 111 coupled to an n-type power feeding region 111VD is configured as a cathode. A reverse-biased pn junction is provided between the n-type well region 111 and the p-type semiconductor region 111A configuring the anode. In this arrangement, when the detection diode 200 is irradiated with laser light, a current leakage occurs at the reverse-biased pn junction between the n-type well region 111 and the p-type semiconductor region 111A configuring the anode. Thus, a current flow through a path PS4, causing an inversion to a low level in an input to a buffer 201 located at a stage posterior to the detection diode 200. This inversion sets the flip-flop SRFF 202, thereby producing a high-level detection signal D_rst.

As described above, a plurality of detection diodes 200 are coupled for each pair of buffers 201. Hence, it is possible to attain a higher degree of area efficiency than that in a case where a buffer is disposed for each detection diode 200, and also to attain a higher detection speed than that in a case where no buffers are disposed.

<Increase in Light-Receiving Area>

Figure 26:
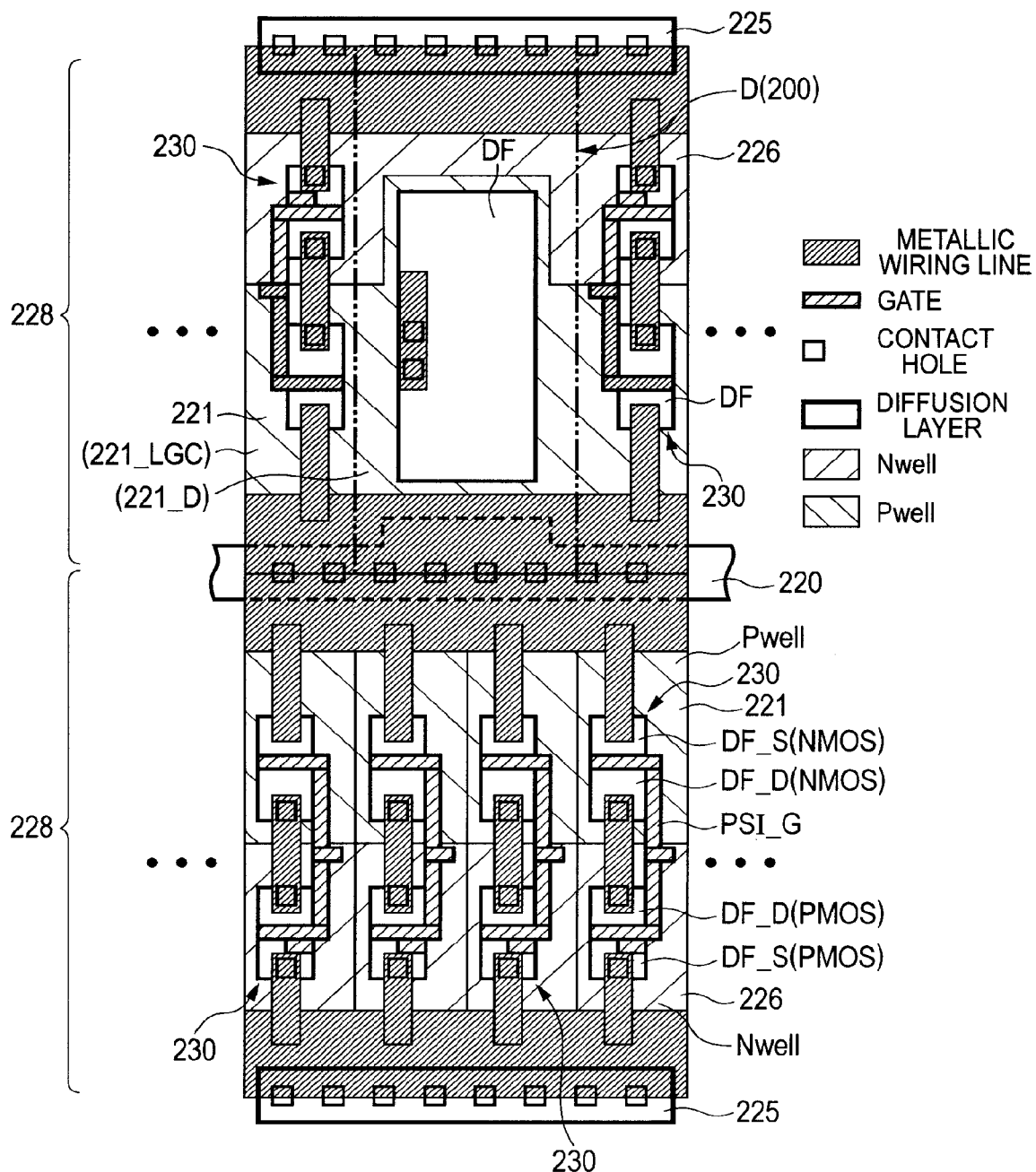
FIG. 26 is a plan view showing an exemplary layout of a detection diode.

Referring to FIG. 26, there is shown an exemplary layout of the detection diode 200. It is assumed here that a CMOS semiconductor integrated circuit is formed. In a semiconductor region 228 having a predetermined height dimension, a p-type well region 221 receiving power from a ground line 220 is in juxtaposition with an n-type well region 226 receiving power from a power supply line 225. In addition to the detection diode 200 used as a photodetector element D, the semiconductor region 228 contains another circuit 230 formed adjacently thereto. In the example shown in FIG. 26, a CMOS inverter is formed as another circuit. In FIG. 26, reference code DF_S (NMOS) indicates an n-type semiconductor diffusion layer configuring a source electrode of an n-channel MOS transistor, reference code DF_D (NMOS) indicates an n-type semiconductor diffusion layer configuring a drain electrode of an n-channel MOS transistor, reference code DF_S (PMOS) indicates a p-type semiconductor diffusion layer configuring a source electrode of a p-channel MOS transistor, reference code DF_D (PMOS) indicates a p-type semiconductor diffusion layer configuring a drain electrode of a p-channel MOS transistor, and reference code PSI_G indicates a polysilicon gate electrode of a MOS transistor.

Figure 27:
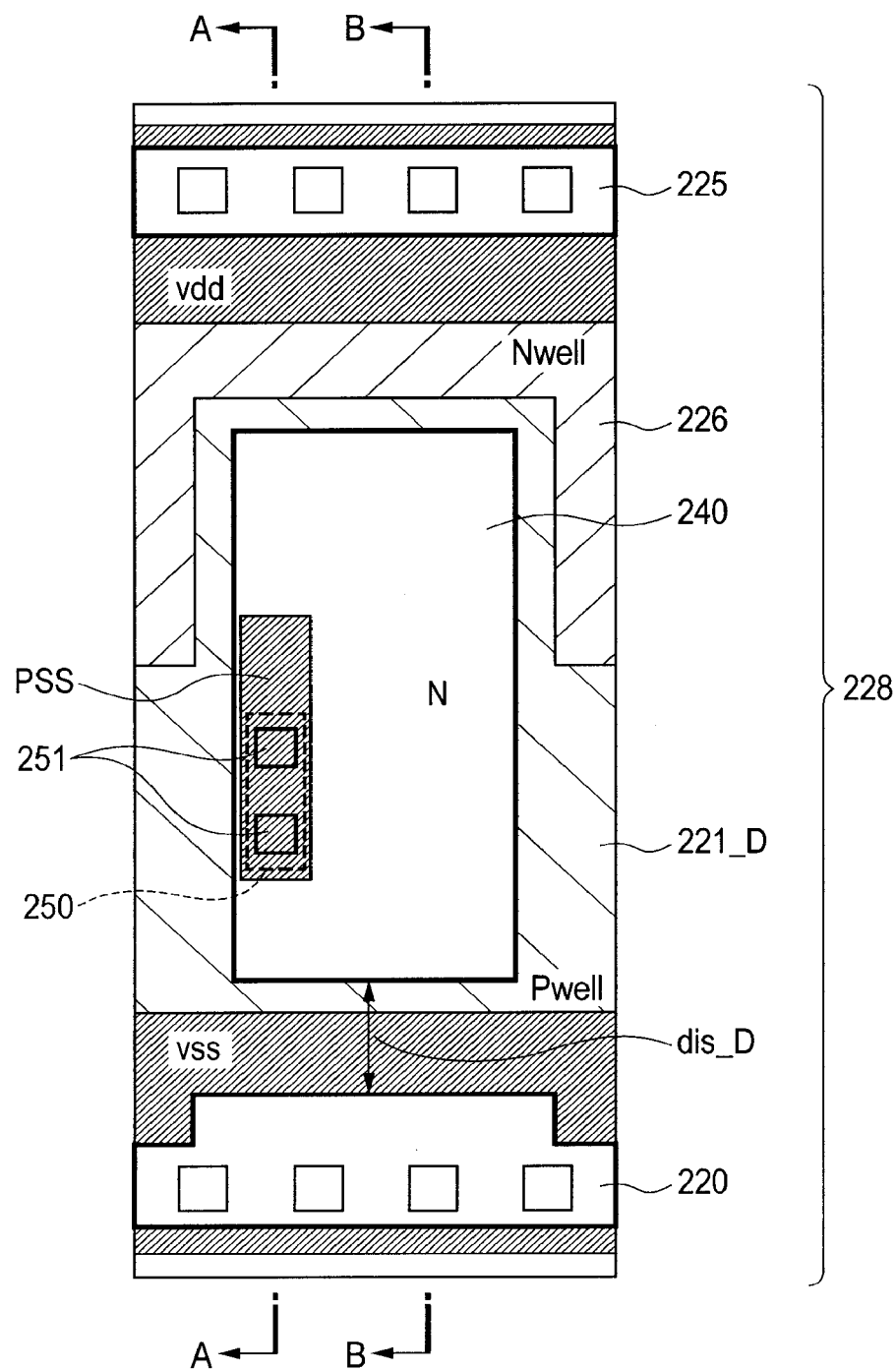
FIG. 27 is a detailed explanatory diagram of the layout of the detection diode.
Figure 28:
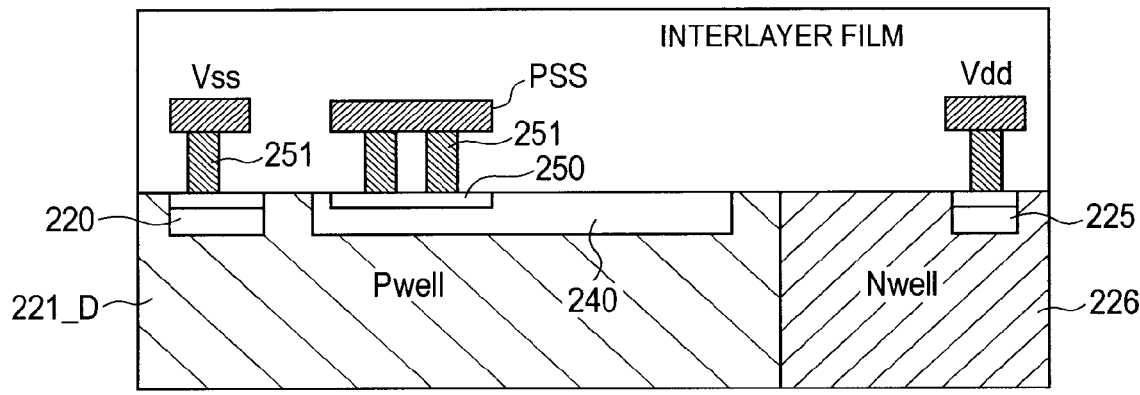
FIG. 28 is a sectional view taken along the arrowed line A-A in FIG. 27.
Figure 29:
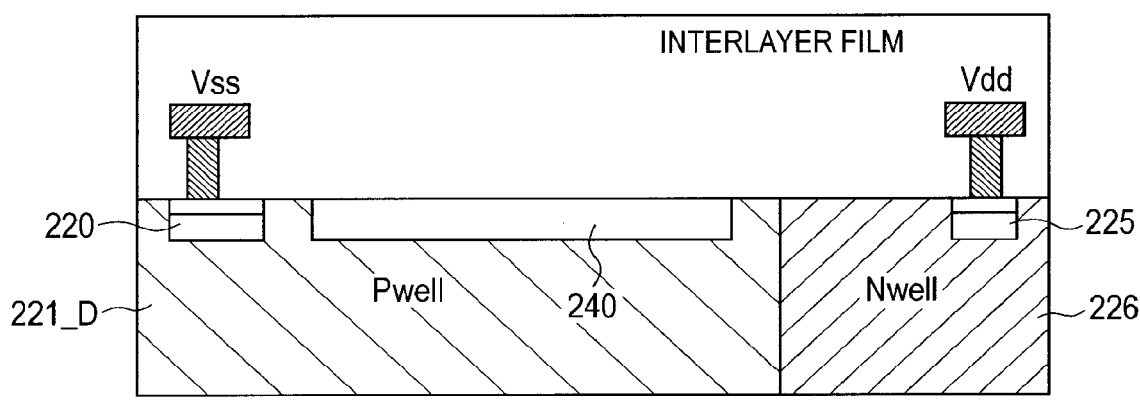
FIG. 29 is a sectional view taken along the arrowed line B-B in FIG. 27.

Referring to FIG. 27, there is shown a detailed explanatory diagram of the layout of the detection diode. FIG. 28 shows a sectional view taken along the arrowed line A-A in FIG. 27, and FIG. 29 shows a sectional view taken along the arrowed line B-B in FIG. 27.

The layout shown in FIG. 27 pertains to a configuration wherein the detection diode 200 is reverse-biased with respect to the ground line 220, i.e., the cathode of the detection diode 200 is coupled the signal path PSS and the anode thereof is coupled to the ground line 220. A p-type well region 221_D containing the detection diode 200 is enlarged as compared with the height dimension of a p-type well region 221_LGC containing the logic circuit. An n-type semiconductor diffusion layer 240 having a pn junction with the enlarged p-type well region 221_D is configured as a cathode. Thus, the light receiving area of the detection diode 200 is increased to enable enhancement in detection sensitivity.

Further, a p-type semiconductor region corresponding to the ground line 220, from which the ground voltage Vss is applied to the p-type well region 221_D containing the detection diode 200, is arranged to protrude toward the opposing side of the n-type semiconductor diffusion layer 240 configuring the cathode. Thus, there is provided a relatively short distance dimension dis_D. In the p-type well region 221_LGC containing the logic circuit, the ground line 220 is not protruded unlike the above arrangement. Since a relatively short distance dimension is provided between the n-type semiconductor diffusion layer 240 corresponding to a light receiving area and the ground line 220_D, a path of a leak current to be fed to the p-type well region 221_D is shortened, thereby enhancing light detection sensitivity in the detection diode.

Further, a salicide (self-aligned salicide) area 250 for coupling the signal path PSS formed by a metallic wiring line (metallic layer) to the n-type semiconductor diffusion layer 240 via a contact hole 251 with low resistance is formed limitedly in a part of the n-type semiconductor diffusion layer 240, e.g., the salicide area 250 is formed limitedly in a peripheral part of the contact hole 251 between the n-type semiconductor diffusion layer 240 and the metallic layer corresponding to the signal path PSS. The salicide area formed limitedly as mentioned above makes it possible to prevent a decrease in detection sensitivity, which would otherwise be incurred by optical shielding over the entire n-type semiconductor diffusion layer 240. It is to be noted that a salicide area is formed over almost the entire surfaces of the other diffusion layers.

Figure 25:
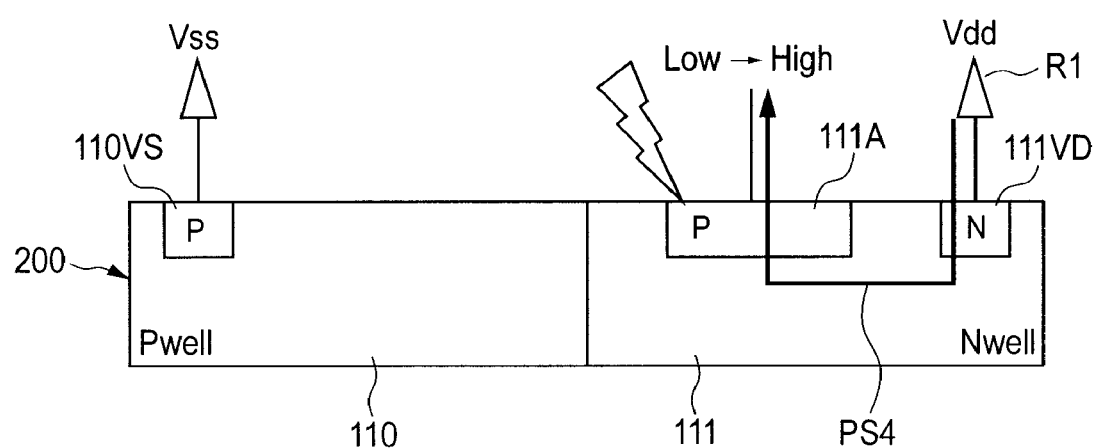
FIG. 25 is a longitudinal section view of a detection diode device structure corresponding to the circuit shown in FIG. 24.

Although not illustrated in the accompanying drawings, it is to be understood that the above technical description given with reference to FIGS. 27 to 29 is also applicable to the circuit configuration wherein the detection diode 200 is coupled in a reverse-biased state with respect to the power supply terminal Vdd as shown in FIGS. 24 and 25. That is, in essence, there may be provided an alternative arrangement just by mutually replacing the conduction types "p" and "n" of the semiconductor regions described with reference to FIGS. 27 to 29 and also mutually replacing the power supply voltage and the ground voltage described with reference thereto. Regarding the alternative arrangement, no repetitive description is given herein.

<Power Feeding Capacity and $V_{LT}$ of Buffer>

Figure 30:
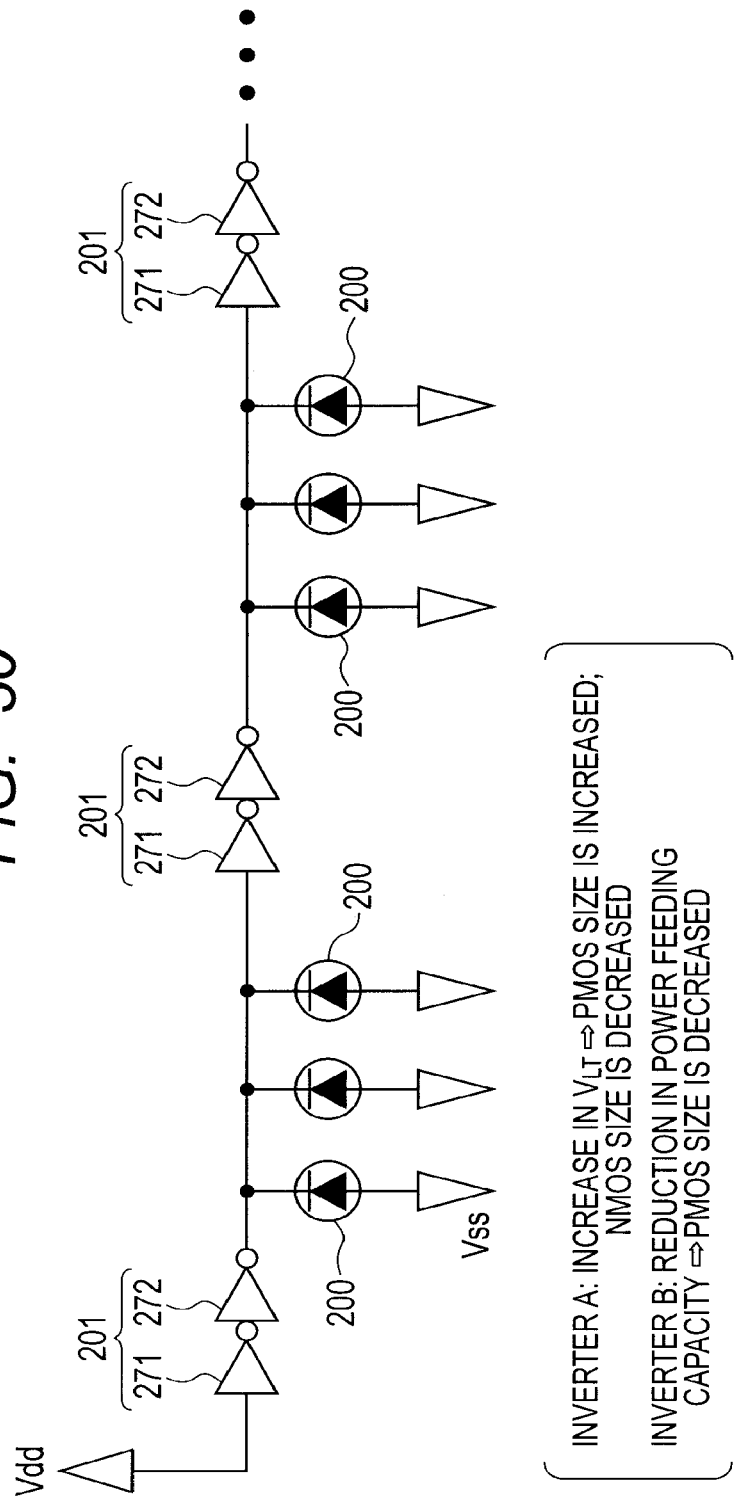
FIG. 30 is a circuit diagram showing an example where detection sensitivity to laser light irradiation is enhanced through buffer arrangement in the circuit configuration shown in FIG. 22.

Referring to FIG. 30, there is shown an example where detection sensitivity to laser light irradiation is enhanced through buffer arrangement in the circuit configuration shown in FIG. 22. The detection diode 200 is reverse-biased between the signal path PSS and the ground line Vss, i.e., the cathode of the detection diode 200 is coupled to the signal path PSS and the anode thereof is coupled to the ground line Vss. The buffer is configured in a series-circuit form comprising two CMOS inverters 271 and 272. In this configuration, a logical threshold voltage $V_{LT}$ of the primary-stage CMOS inverter 201 is set to be higher than that of the inverter included in the logic circuit, thereby enabling enhancement in detection sensitivity. That is, it is conditioned that the logical threshold voltage of the primary-stage CMOS inverter is higher than that of the posterior-stage CMOS inverter and that of the inverter included in the logic circuit. Under this condition, when an input potential varies due to laser light irradiation, i.e., when a high-level input voltage varies to cause a temporary decrease in potential, it is possible to invert an output of the inverter faster in response to potential variation, contributing to enhancement in detection sensitivity.

A power current feeding capacity of the posterior-stage CMOS inverter 272 is set to be smaller than that of the primary-stage CMOS inverter 271. For example, in the CMOS inverter 271, the size of the p-channel MOS transistor thereof is increases while the size of the n-channel MOS transistor thereof is decreased. In the CMOS inverter 272, the size of the p-channel MOS transistor thereof is made smaller than the size of the n-channel MOS transistor thereof.

Since the logical threshold voltage of the primary-stage CMOS inverter 271 is higher than that of the posterior-stage CMOS inverter 272, it is possible to increase detection sensitivity to a logical value inversion due to current drawing from the cathode of the detection diode 200 at the time of light irradiation thereto. Further, the power current feeding capacity of the posterior-stage CMOS inverter 272 is smaller than that of the primary-stage CMOS inverter 271, it is possible to increase the speed of current drawing from the cathode of the detection diode 200 at the time of light irradiation thereto. Thus, a higher level of sensitivity in light detection can be realized.

Although not illustrated in the accompanying drawings, it is to be understood that the above technical description given with reference to FIG. 30 is also applicable to the circuit configuration wherein the detection diode 200 is coupled in a reverse-biased state with respect to the power supply terminal Vdd as shown in FIGS. 24 and 25. That is, detection sensitivity can be enhanced by decreasing the logical threshold voltage of the primary-stage inverter to a level lower than that of the inverter included in the logic circuit.

A ground current feeding capacity of the posterior-stage inverter is set to be smaller than that of the primary-stage inverter. Since the logical threshold voltage of the primary-stage inverter is lower than that of the inverter included in the logic circuit, it is possible to enhance detection sensitivity to a logical value inversion due to current feeding to the anode of the detection diode at the time of light irradiation thereto. Further, since the ground current feeding capacity of the posterior-stage inverter is smaller than that of the primary-stage inverter, it is possible to increase the speed of current feeding to the anode of the detection diode at the time of light irradiation thereto. Thus, a higher level of sensitivity in light detection can be realized.

<Diode Parallel-Coupling Layout>

Figure 21:
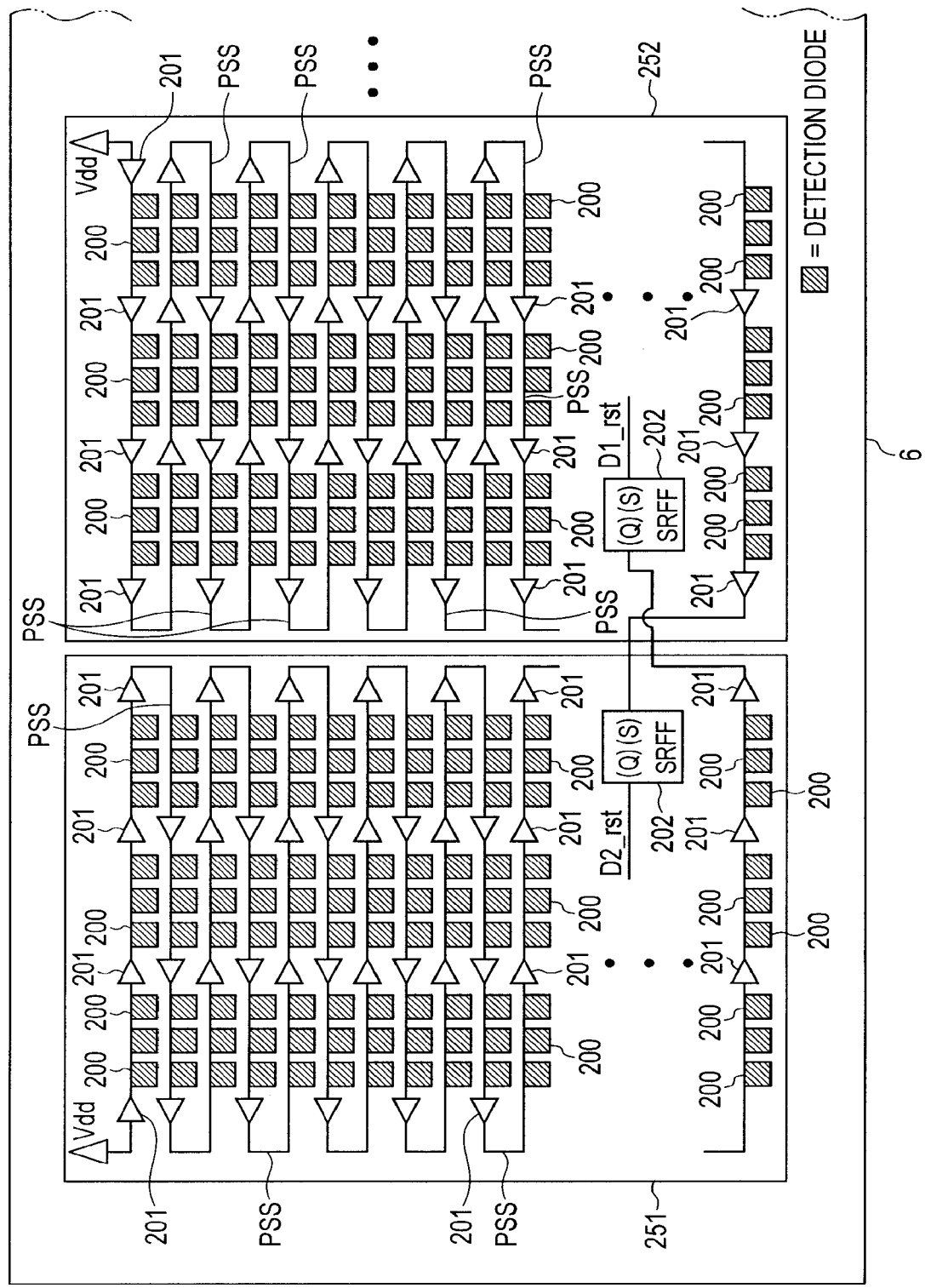
FIG. 21 is a block diagram illustrating an array configuration of detection diodes in a logic circuit of a microcomputer according to a preferred embodiment 2 of the present invention.

Referring to FIG. 21, there is shown an array configuration wherein a multiplicity of detection diodes 200 are coupled. In the configuration shown in FIG. 21, it is assumed that a plurality partial circuit regions represented by partial circuit regions 251 and 252 are provided in a region for the logic circuit 6, for example. In each of the partial circuit regions 251, 252, and so forth, a multiplicity of detection diodes 200 are distributively disposed in a juxtaposed fashion between the ground line Vss and a plurality of series-coupled buffers 201 that are arranged to have a constant logical value of primary-stage input, e.g., a high-level (power supply voltage level) logical value "1". Regarding the layout patterning of the detection diodes 200 and the logical threshold voltage of the buffer 201, the techniques described hereinbefore are applicable in a similar manner.

In a case where an array of detection diodes 200 is formed in each of the partial circuit regions 251, 252, and so forth, a flip-flop SRFF 202 serving as a detection circuit for detecting a logical value inversion on the signal path PSS due to a current leakage in the detection diode 200 at the time of laser light irradiation is disposed in a partial circuit region different from a partial circuit region containing the array of detection diodes 200 coupled with the flip-flop SRFF 202. That is, a signal D1_det obtained at the last stage of the array of detection inverters 200 in the partial circuit region 251 is fed to a set terminal (S) of a flip-flop SRFF 202 disposed in the partial circuit region 252, causing the flip-flop SRFF 202 to produce a signal D1_rst from an output terminal (Q) thereof. Likewise, a signal D2_det obtained at the last stage of the array of detection diodes 200 in the partial circuit region 252 is fed to a set terminal (S) of a flip-flop SRFF 202 disposed in the partial circuit region 251, causing the flip-flop SRFF 202 to produce a signal D2_rst from an output terminal (Q) thereof. Thus, it is possible to prevent the occurrence of a malfunction in each flip-flop SRFF 102 due to local light irradiation.

Using detection signals D1_rst to Dn_rst, control operation can be performed in a manner similar to that in the example described above with reference to FIG. 18. Thus, protection is provided against illegal tampering with programs stored in a data processing unit such as the CPU 15 and illegal access to secret data to be used by the data processing unit.

Preferred Embodiment 3

Figure 31:
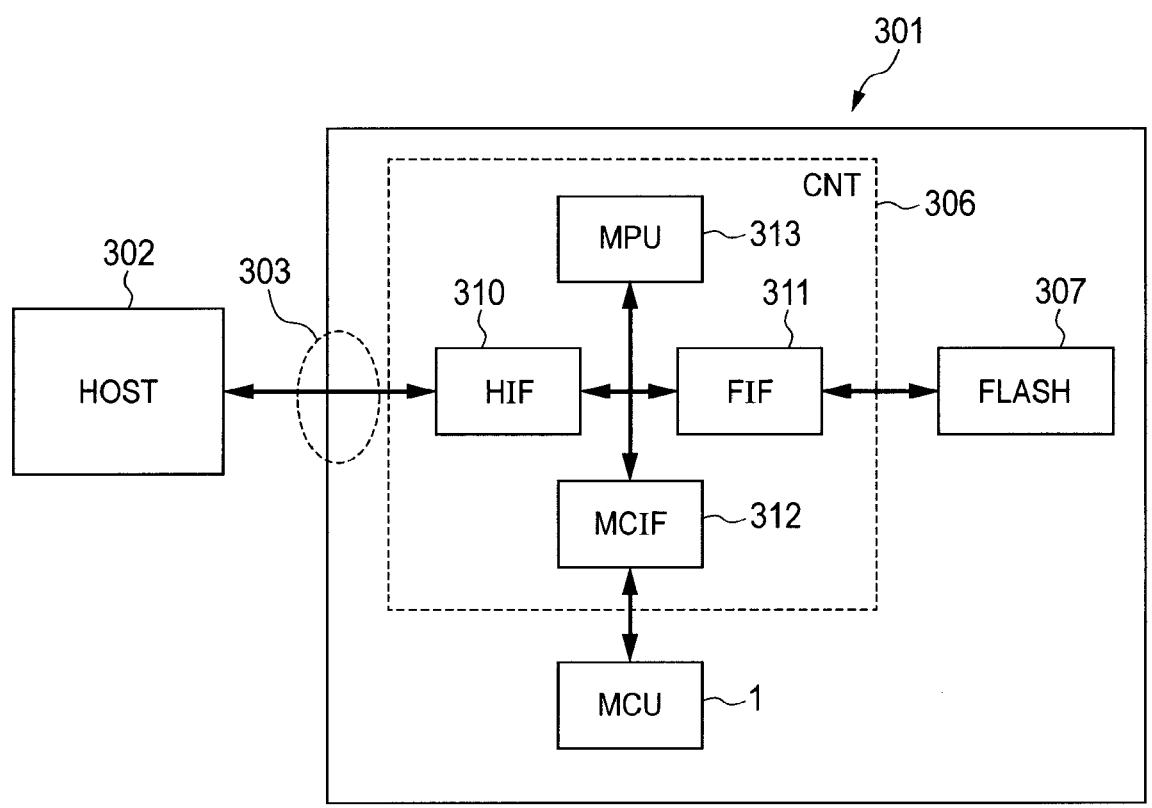
FIG. 31 is a block diagram illustrating a data processing system employing the microcomputer according to either one of the preferred embodiments 1 and 2 of the present invention.

Referring to FIG. 31, there is shown a data processing system employing the microcomputer 1 described above. As an exemplary IC card used for data processing, a multi-function SIM (Subscriber Identity Module) card 301 is indicated in FIG. 31. The multi-function SIM card 301 is mounted on such an apparatus as a mobile telephone, a mobile data terminal, or a personal computer (PC) for the purpose of user authentication in mobile communication, specific transactions, or the like. Reference numeral 302 in FIG. 31 indicates a host unit (HOST) on which the multi-function SIM card 301 is mounted. Interfacing with the HOST 302 is provided by using a cable 303, for example.

The multi-function SIM card 301 comprises an interface controller (CNT) 306, a flash memory (FLASH) 307 serving as an electrically rewritable nonvolatile memory, and a microcomputer 1 (mounted on a circuit board not shown). The interface controller 306 includes a host interface (HIF) 310, a memory interface (FIF) 311, a microprocessor (MPU) 313, and a microcomputer interface (MCIF) 312. According to instructions or command signals issued from the HOST 302, the MPU 313 conducts control operations such as access control to the FLASH 307 and authentication using the MCU 1.

In the MCU 1 used for authentication processing or the like, there are provided photodetector elements D requiring just a small chip occupancy area. Hence, no particular constraint is imposed on a layout design arrangement of the photodetector elements in terms of area dimensions in most cases. On account of the condition that an adequate number of photodetector elements are mountable, reliable detectability of light irradiation can be ensured with ease. Thus, it is possible to provide a high level of security against a fault-based attack to the data processing system.

While the present invention made by the present inventors has been described in detail with respect to specific embodiments thereof, it is to be understood that the present invention is not limited by any of the details of description and that various changes and modifications may be made in the present invention without departing from the spirit and scope thereof.

For example, a portion using inverter circuits as detection devices and a portion using detection diodes may be mixedly contained in a single semiconductor integrated circuit. Further, the semiconductor integrated circuit according to the present invention is not limited to a CMOS integrated circuit in application, i.e., the present invention is applicable to a variety of integrated circuits including a bipolar integrated circuit and a MOS-bipolar hybrid integrated circuit. The logic circuit (LGC) in the present invention may include a central processing unit (CPU), an interrupt controller (INTC), a system controller (SYSC), a watchdog timer (WDT), an encryption module (ENCRP), a timer (TMR), and an external interface port (PRT), though not particularly limited thereto, i.e., the logic circuit may include any component circuits as required for each specific application. The data processing system employing the microcomputer 1 in the present invention is not limited to the multi-function SIM card 300 but is implementable in a variety of forms for consumer and industrial electronic apparatuses.

What is claimed is:

1. A semiconductor integrated circuit having a semiconductor chip, comprising:
   a logic circuit;
   a plurality of series-coupled buffers that are distributively disposed in a region containing the logic circuit and are arranged to have a constant logical value of primary-stage input;
   a plurality of parallel-coupled detection diodes that are in a reverse-biased state with respect to a signal path between an input of each of the buffers and an output of a buffer located at a stage anterior thereto;
   a detection circuit for detecting an input logical value inversion due to a change to a forward-biased state in the detection diode at the time of light irradiation; and
   a limiter circuit for imposing limitation on operation of the logic circuit in response to the input logical value inversion detected by the detection circuit,
   the logic circuit, the series-coupled buffers, the parallel-coupled detection diodes, the detection circuit, and the limiter circuit being formed in the single semiconductor chip.

2. The semiconductor integrated circuit according to claim 1,
   wherein the logic circuit and the detection diode are formed in a semiconductor region having a predetermined height dimension in which a p-type well region receiving power from a ground line is in juxtaposition with an n-type well region receiving power from a power supply line,
   wherein, with the cathode of the detection diode coupled to the signal path and the anode thereof coupled to the ground line, a p-type well region containing the detection diode is enlarged as compared with the height dimension of a p-type well region containing the logic circuit, and
   wherein an n-type semiconductor region having a pn junction with the enlarged p-type well region is configured as a cathode.

3. The semiconductor integrated circuit according to claim 2,
   wherein a p-type semiconductor region corresponding to a ground line, from which power feeding is applied to the p-type well region containing the detection diode, is arranged to protrude toward the opposing side of the n-type semiconductor region configuring the cathode.

4. The semiconductor integrated circuit according to claim 2,
   wherein, with the cathode of the detection diode coupled to the signal path and the anode thereof coupled to the ground line, the buffer is configured of primary-stage and posterior-stage inverters coupled in series, and
   wherein a logical threshold voltage of the primary-stage inverter is set to be higher than that of the posterior-stage inverter, and a power current feeding capacity of the posterior-stage inverter is set to be smaller than that of the primary-stage inverter.

5. The semiconductor integrated circuit according to claim 2,
   wherein, with the anode of the detection diode coupled to the signal path and the cathode thereof coupled to the power supply line, the buffer is configured of primary-stage and posterior-stage inverters coupled in series, and wherein a logical threshold voltage of the primary-stage inverter is set to be lower than that of the posterior-stage inverter, and a ground current feeding capacity of the posterior-stage inverter is set to be smaller than that of the primary-stage inverter.

6. The semiconductor integrated circuit according to claim 2,
wherein a silicide area for coupling the n-type semiconductor region containing the pn junction to a metallic layer corresponding to the signal path is formed limitedly in a peripheral part of a contact hole between the n-type semiconductor region and the metallic layer.

7. The semiconductor integrated circuit according to claim 1,
wherein the logic circuit and the detection diode are formed in a semiconductor region having a predetermined height dimension in which a p-type well region receiving power from a ground line is in juxtaposition with an n-type well region receiving power from a power supply line,
wherein, with the anode of the detection diode coupled to the signal path and the cathode thereof coupled to the power supply line, the n-type well region containing the detection diode is enlarged as compared with the height dimension of an n-type well region containing the logic circuit, and
wherein a p-type semiconductor region having a pn junction with the enlarged n-type well region is configured as an anode.

8. The semiconductor integrated circuit according to claim 7,
wherein the n-type semiconductor region corresponding to a power supply line, from which power feeding is applied to the n-type well region containing the detection diode, is arranged to protrude toward the opposing side of the p-type semiconductor region configuring the anode.

9. The semiconductor integrated circuit according to claim 8,
wherein a silicide area for coupling the p-type semiconductor region containing the pn junction to a metallic layer corresponding to the signal path is formed limitedly in a peripheral part of a contact hole between the p-type semiconductor region and the metallic layer.

10. The semiconductor integrated circuit according to claim 1,
wherein a series circuit of the buffers and diodes, and a detection circuit are disposed individually in each of partial circuit regions of the logic circuit, and
wherein the series circuit of the buffers and inverters, and the detection circuit disposed in each partial circuit region are coupled so as to provide a form of coupling between mutually different circuit regions.

11. The semiconductor integrated circuit according to claim 1, further comprising:
a plurality of memory devices to be used by the logic circuit,
wherein the logic circuit includes a plurality of data processing units for carrying out data processing operations by using information held in the memory devices.

12. A data processing system comprising:
a plurality of semiconductor integrated circuits mounted over a circuit board,
wherein at least one of the semiconductor integrated circuits is arranged to have a logic circuit including a plurality of data processing units for carrying out data processing operations, and
wherein the at least one of the semiconductor integrated circuits comprises: a plurality of series-coupled buffers that are distributively disposed in a region containing the logic circuit and are arranged to have a constant logical value of primary-stage input; a plurality of parallel-coupled detection diodes that are in a reverse-biased state with respect to a signal path between an input of each of the buffers and an output of a buffer located at a stage anterior thereto; a detection circuit for detecting an input logical value inversion due to a change to a forward-biased state in the detection diode at the time of light irradiation; and a limiter circuit for imposing limitation on operation of the logic circuit in response to the input logical value inversion detected by the detection circuit.

* * * * *